(12) United States Patent
Sakai et al.

(10) Patent No.: US 10,417,756 B2
(45) Date of Patent: Sep. 17, 2019

(54) PATTERN MEASUREMENT APPARATUS AND DEFECT INSPECTION APPARATUS

(71) Applicant: Hitachi High-Technologies Corporation, Minato-ku, Tokyo (JP)

(72) Inventors: Kei Sakai, Tokyo (JP); Satoru Yamaguchi, Tokyo (JP); Kazuyuki Hirao, Tokyo (JP); Yasunori Takasugi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 37 days.

(21) Appl. No.: 15/545,067

(22) PCT Filed: Jan. 23, 2015

(86) PCT No.: PCT/JP2015/051757
§ 371 (c)(1),
(2) Date: Jul. 20, 2017

(87) PCT Pub. No.: WO2016/117104
PCT Pub. Date: Jul. 28, 2016

(65) Prior Publication Data
US 2018/0012349 A1    Jan. 11, 2018

(51) Int. Cl.
*G06K 9/00* (2006.01)
*G06T 7/00* (2017.01)
(Continued)

(52) U.S. Cl.
CPC ............ *G06T 7/0004* (2013.01); *G01B 15/04* (2013.01); *G03F 1/86* (2013.01); *G03F 7/70625* (2013.01);
(Continued)

(58) Field of Classification Search
CPC ....... G01B 15/04; G01B 2210/56; G03F 1/86; G03F 7/70625; G06T 7/0004; H01J 37/22; H01J 37/222
See application file for complete search history.

(56) References Cited

U.S. PATENT DOCUMENTS 6,326,618 B1 * 12/2001 Kane ...................... G01B 15/04
250/307
7,965,862 B2 * 6/2011 Jordan ..................... G07D 7/004
382/100
(Continued)

FOREIGN PATENT DOCUMENTS

EP    1 061 330 A1    12/2000
JP    2000-227319 A    8/2000
(Continued)

OTHER PUBLICATIONS

Korean-language Office Action issued in counterpart Korean Application No. 10-2017-7018852 dated Jul. 19, 2018 (4 pages).
(Continued)

*Primary Examiner* — Bhavesh M Mehta
*Assistant Examiner* — Ian L Lemieux
(74) *Attorney, Agent, or Firm* — Crowell & Moring LLP

(57) ABSTRACT

The purpose of the present invention is to provide a pattern measurement apparatus that appropriately assesses patterns formed by patterning methods for forming patterns that do not exist on photomasks. In order to achieve this purpose, the present invention provides a pattern measurement apparatus comprising a processor that measures the dimensions of patterns formed on a sample by using data acquired by irradiating the sample with a beam, wherein the processor extracts pattern coordinate information on the basis of the data acquired by irradiating the sample with a beam, and uses the coordinate information to generate measurement (Continued)

reference data used when performing dimension measurements of the pattern.

5 Claims, 21 Drawing Sheets

(51) Int. Cl.
*H01J 37/22* (2006.01)
*G01B 15/04* (2006.01)
*G03F 1/86* (2012.01)
*G03F 7/20* (2006.01)

(52) U.S. Cl.
CPC ............ *H01J 37/22* (2013.01); *H01J 37/222* (2013.01); *G01B 2210/56* (2013.01); *G06T 2207/10056* (2013.01); *G06T 2207/30148* (2013.01)

(56) References Cited

U.S. PATENT DOCUMENTS

| | | | |
|---|---|---|---|
| 2003/0058435 | A1 | 3/2003 | Honda et al. |
| 2005/0207673 | A1 | 9/2005 | Takane et al. |
| 2007/0274593 | A1 | 11/2007 | Tsuneta et al. |
| 2010/0223697 | A1* | 9/2010 | Moeck .................. G01Q 40/00 850/19 |
| 2011/0075937 | A1* | 3/2011 | Tate ..................... G06K 9/3275 382/218 |
| 2012/0290990 | A1 | 11/2012 | Toyoda et al. |
| 2013/0206601 | A1* | 8/2013 | Fukuyama ............ G01B 11/25 205/81 |
| 2015/0002652 | A1 | 1/2015 | Takasugi et al. |
| 2015/0078650 | A1* | 3/2015 | Sezginer ............ G01N 21/8851 382/141 |
| 2015/0139530 | A1* | 5/2015 | Lavole ..................... G06T 7/70 382/149 |
| 2016/0203594 | A1* | 7/2016 | Morard ................ G01N 23/046 378/4 |
| 2017/0363969 | A1* | 12/2017 | Hauptmann .............. G03F 1/84 |

FOREIGN PATENT DOCUMENTS

| | | |
|---|---|---|
| JP | 2003-98114 A | 4/2003 |
| JP | 2005-195361 A | 7/2005 |
| JP | 2007-294391 A | 11/2007 |
| JP | 2011-137901 A | 7/2011 |
| JP | 2013-137202 A | 7/2013 |
| KR | 10-2001-0015906 | 2/2001 |
| KR | 10-2014-0119097 A | 10/2014 |

OTHER PUBLICATIONS

H. Yaegashi et al., "Novel approaches to implement the self-aligned spacer double-patterning process toward 11-nm node and beyond," Advances in Resist Materials and Processing Technology XXVIII, Proc. of SPIE, 2011, vol. 7972, 832483241-M (seven (7) pages).

B. Rathsack et al., "Pattern scaling with directed self assembly through lithography and etch process integration," Alternative Lithographic Technologies IV, Proc. of SPIE, 2012, vol. 8323, 83230B-1 (fourteen (14) pages).

International Search Report (PCT/ISA/210) issued in PCT Application No. PCT/JP2015/051757 dated Apr. 21, 2015 with English-language translation (three (3) pages).

Japanese-language Written Opinion (PCT/ISA/237) issued in PCT Application No. PCT/JP2015/051757 dated Apr. 21, 2015 (five (5) pages).

Korean-language Office Action issued in counterpart Korean Application No. 10-2017-7018852 dated Jan. 29, 2019 (four (4) pages).

\* cited by examiner

[Fig. 1]
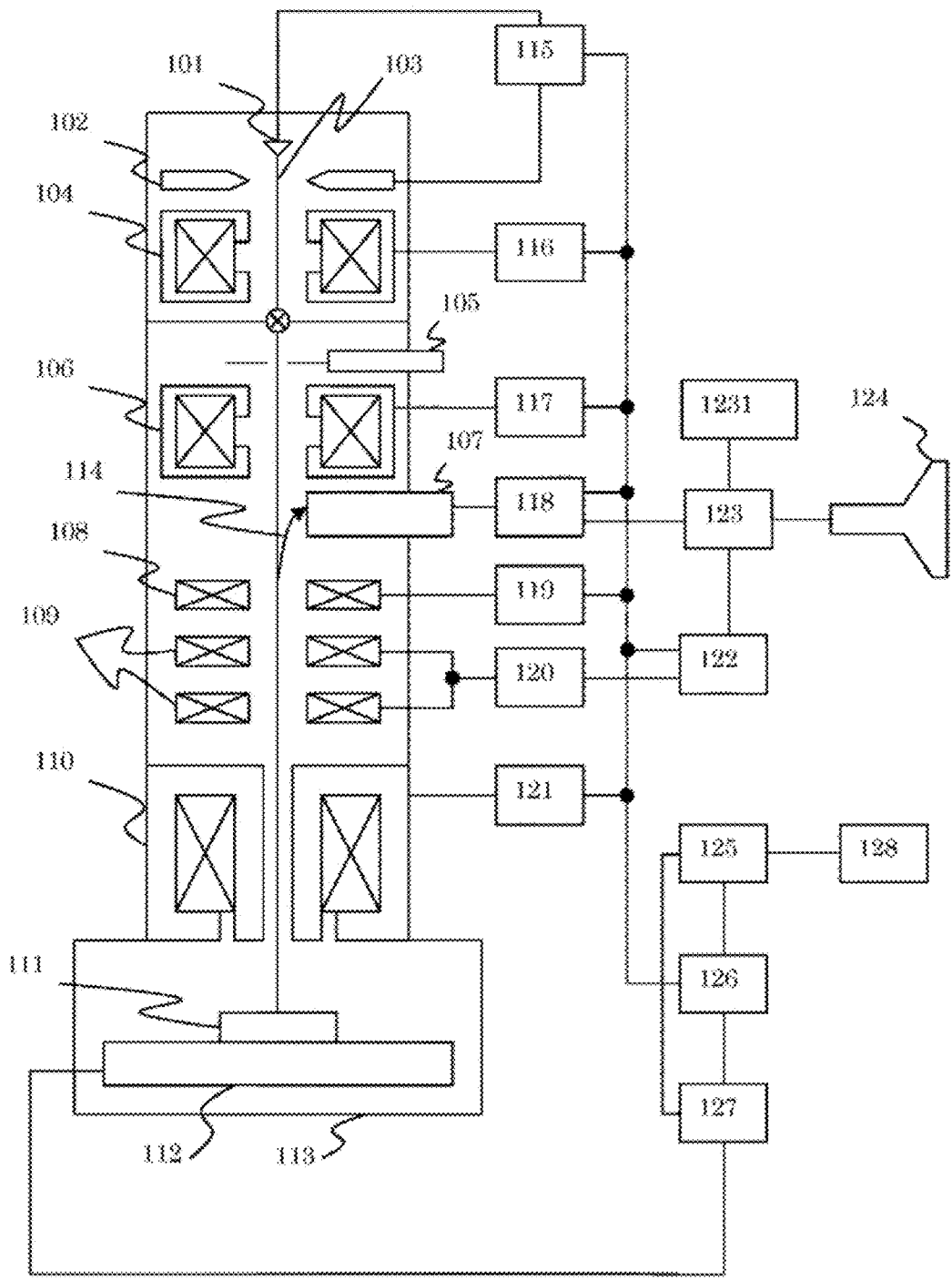

[Fig. 2]

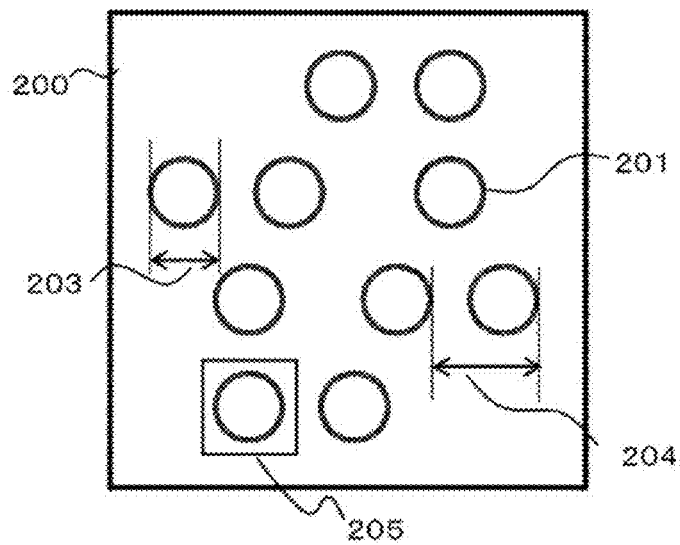

200 MEASUREMENT PATTERN IMAGE
201 MEASUREMENT PATTERN
203 PATTERN CD
204 PATTERN PITCH
205 REGION DESIGNATION CURSOR

[Fig. 3]

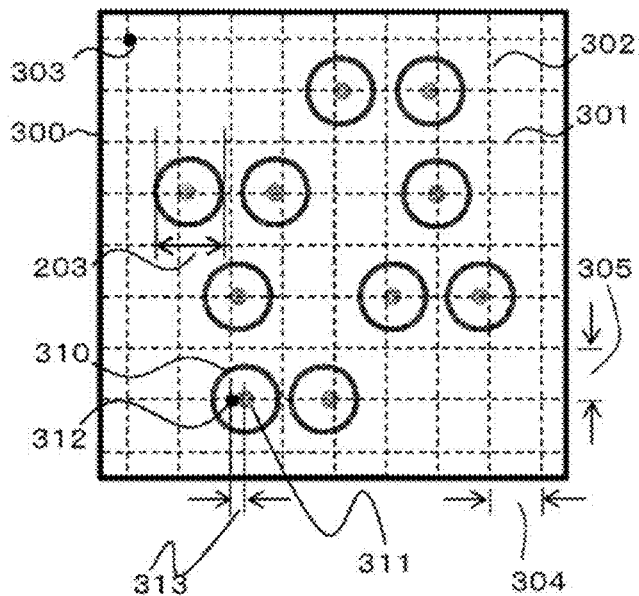

300 GRID ARRANGEMENT SCREEN
301 REFERENCE LINE X
302 REFERENCE LINE Y
303 REFERENCE POINT
304 PITCH X
305 PITCH Y
306 DISTANCE BETWEEN REFERENCE LINE X AND CENTER OF GRAVITY X OF PATTERN
310 MEASUREMENT PATTERN EDGE
311 CENTER OF GRAVITY OF MEASUREMENT PATTERN
312 MEASUREMENT REFERENCE POINT
313 AMOUNT OF DEVIATION OF MEASUREMENT PATTERN

[Fig. 4]
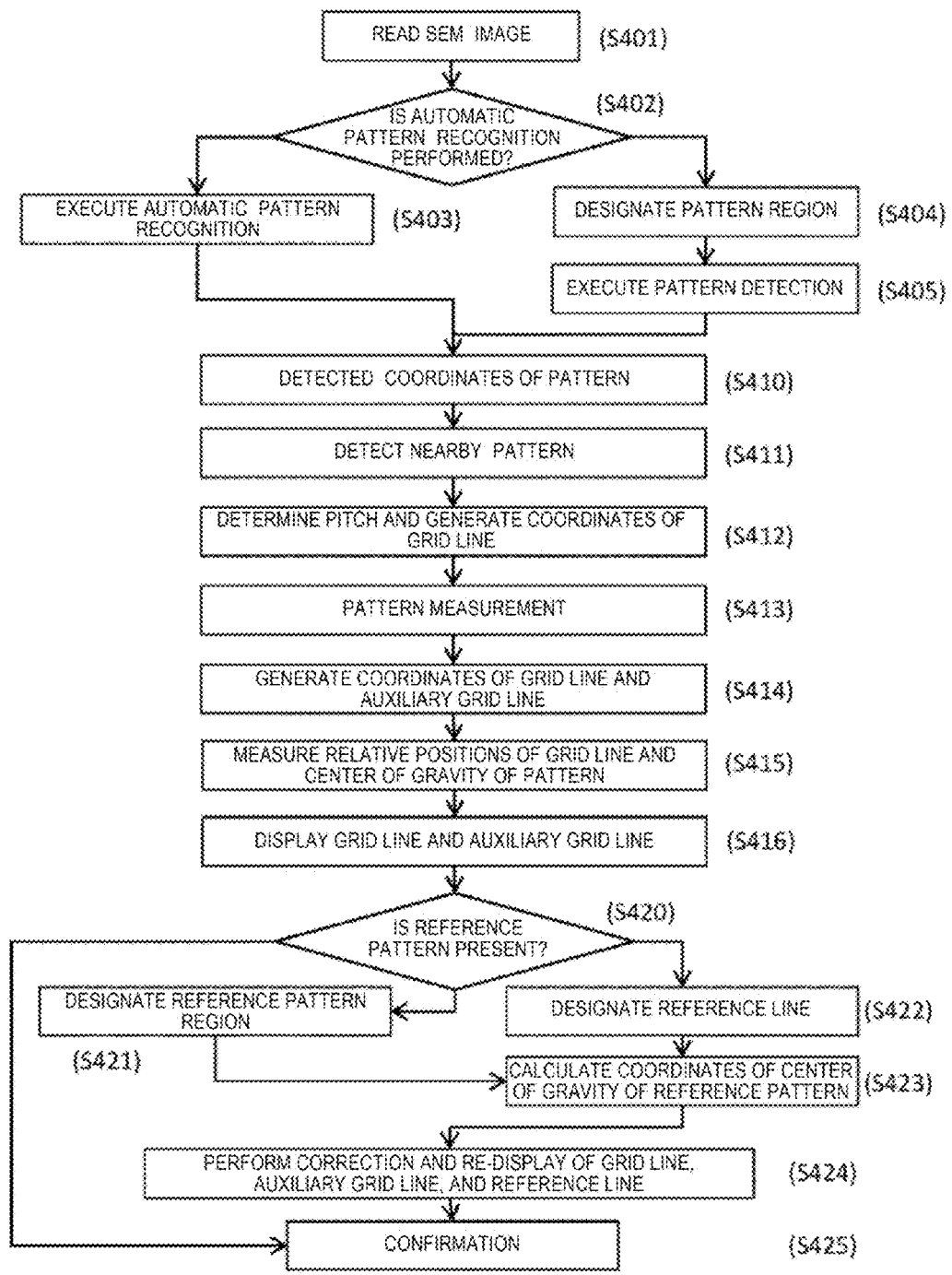

[Fig. 5]
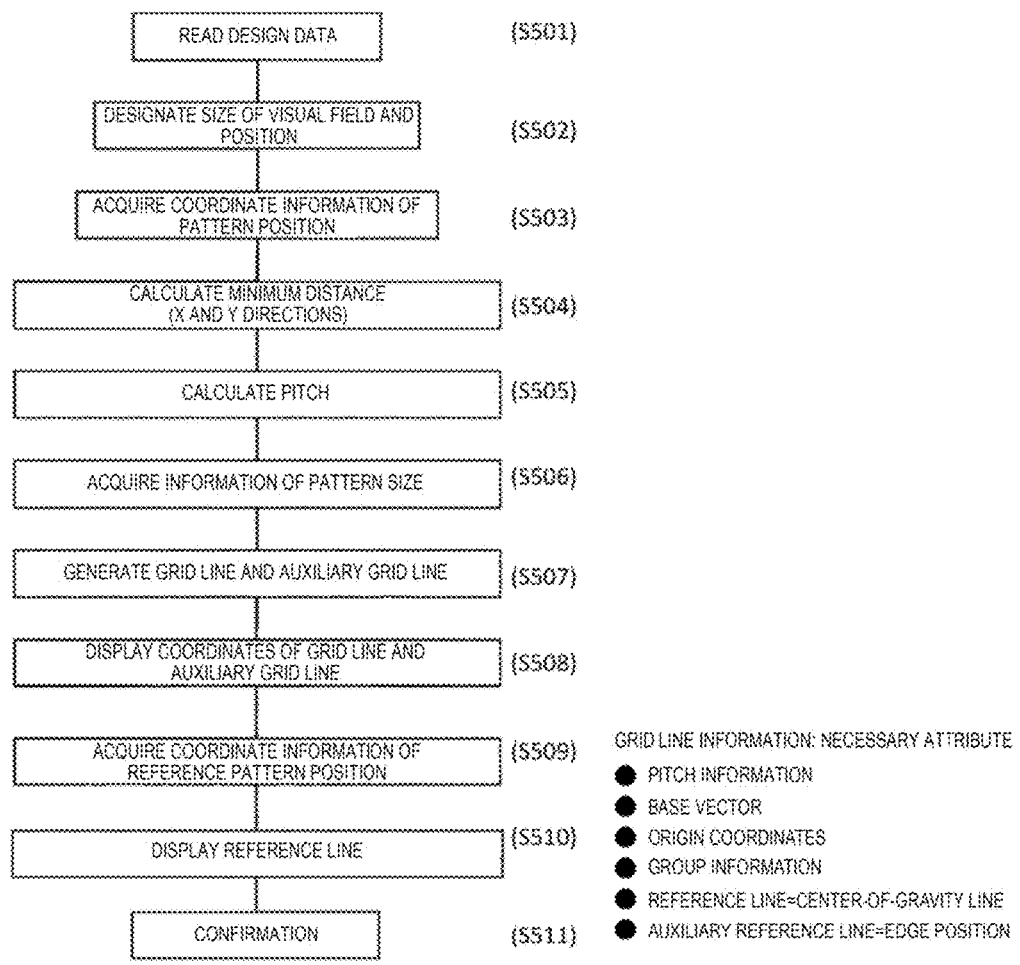

[Fig. 6]
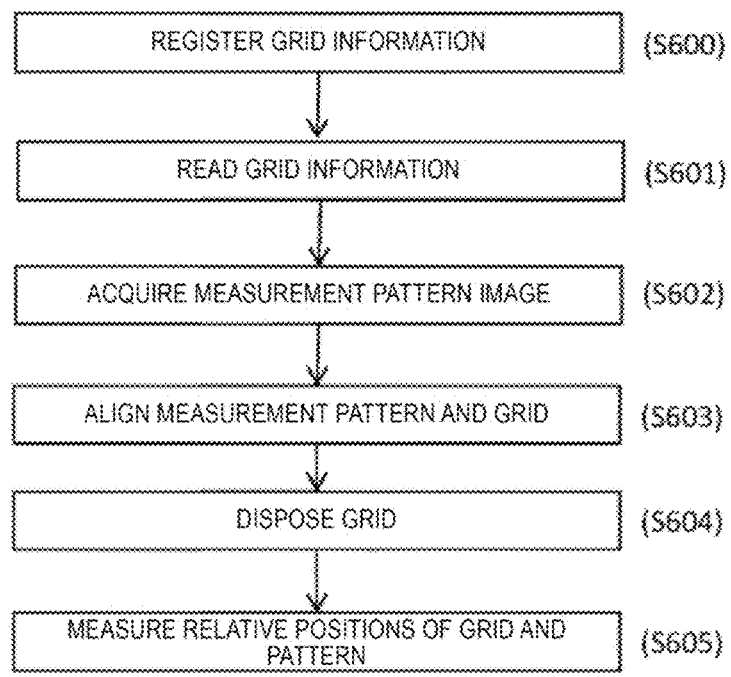

[Fig. 7]
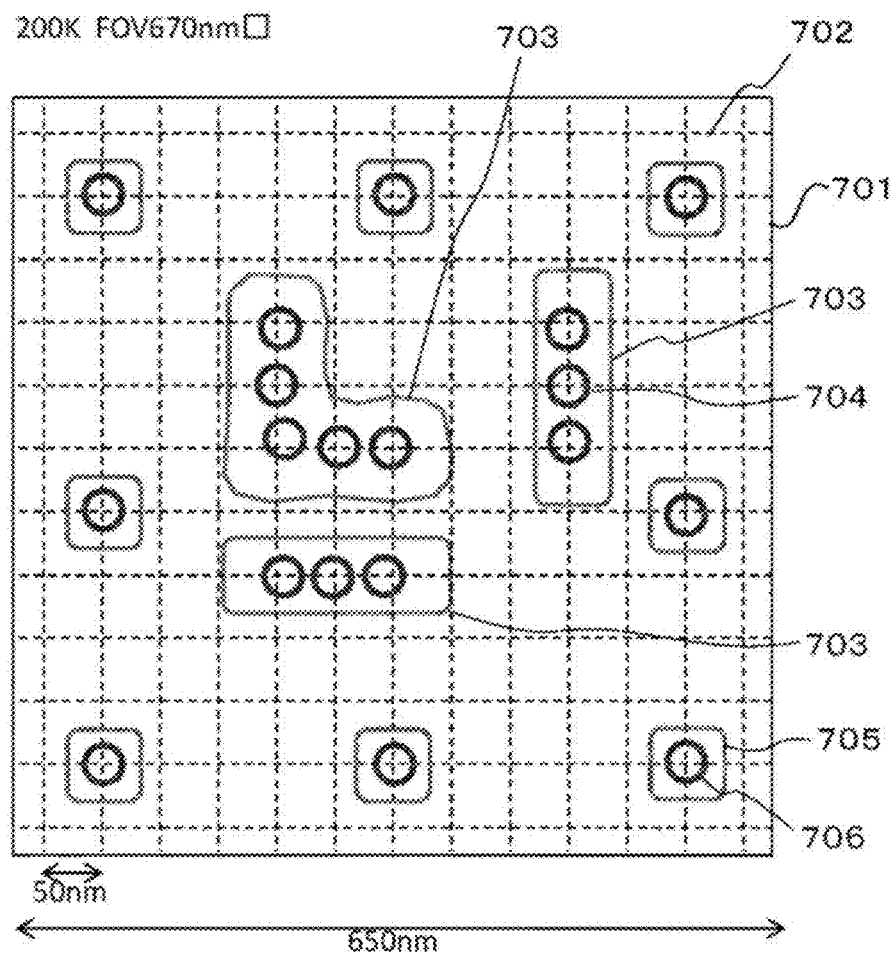

[Fig. 8]
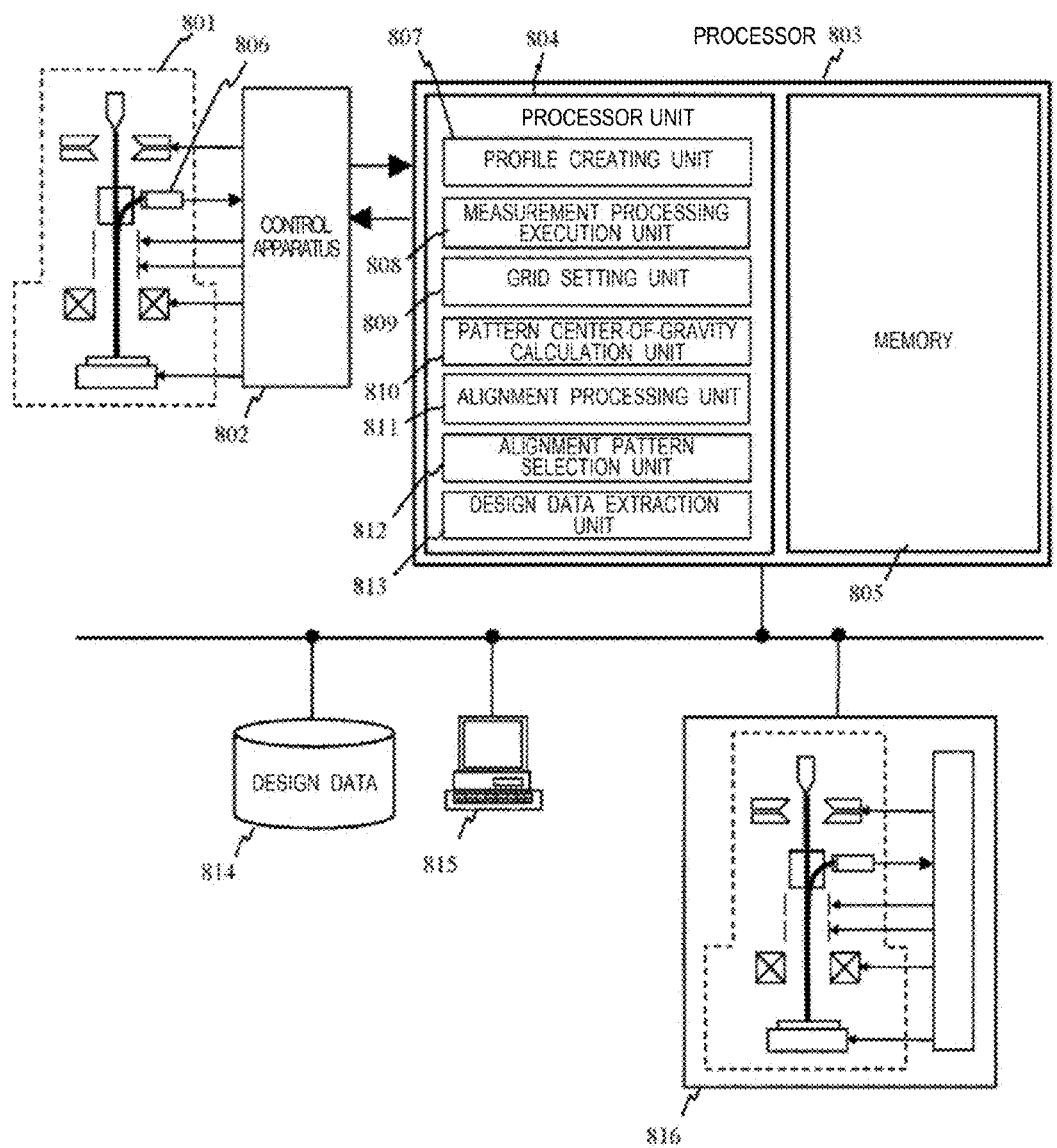

[Fig. 9]
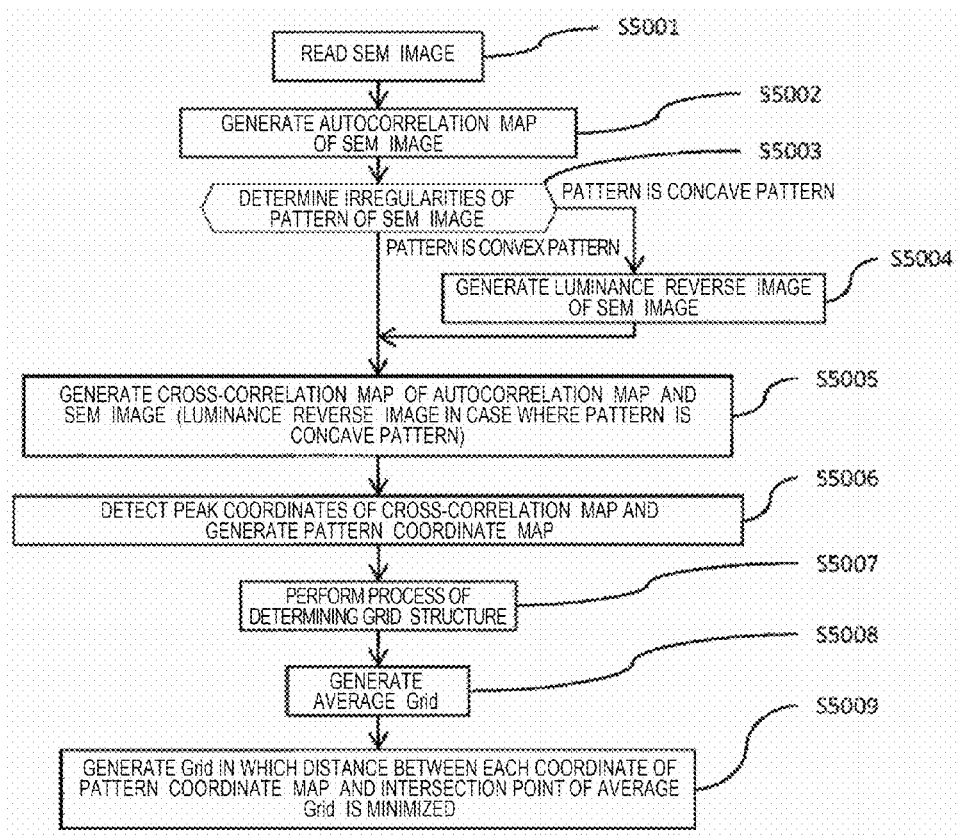
[Fig. 10]
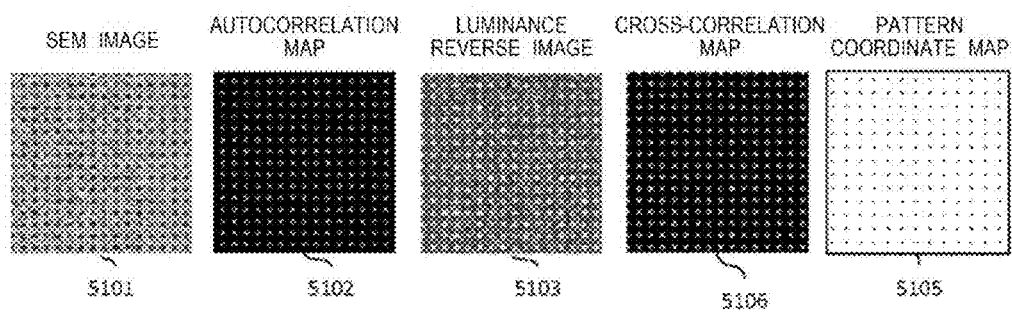

[Fig. 11]
[Fig. 12]
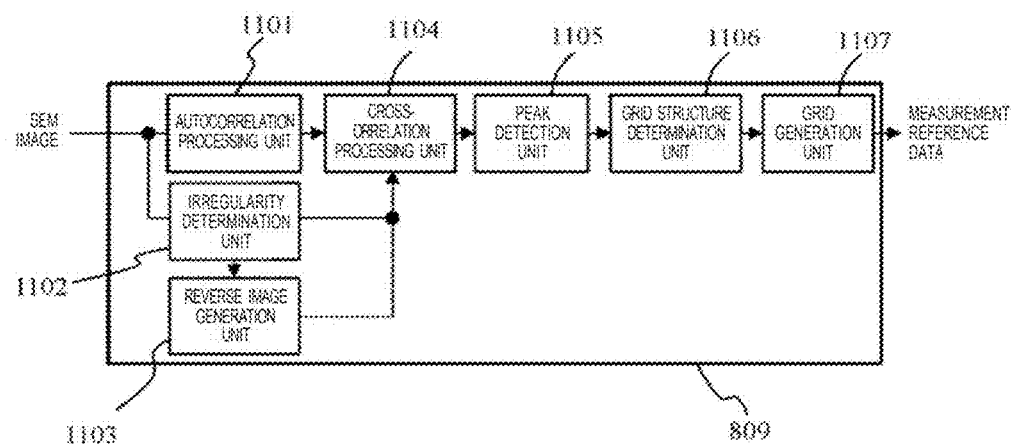

[Fig. 13]
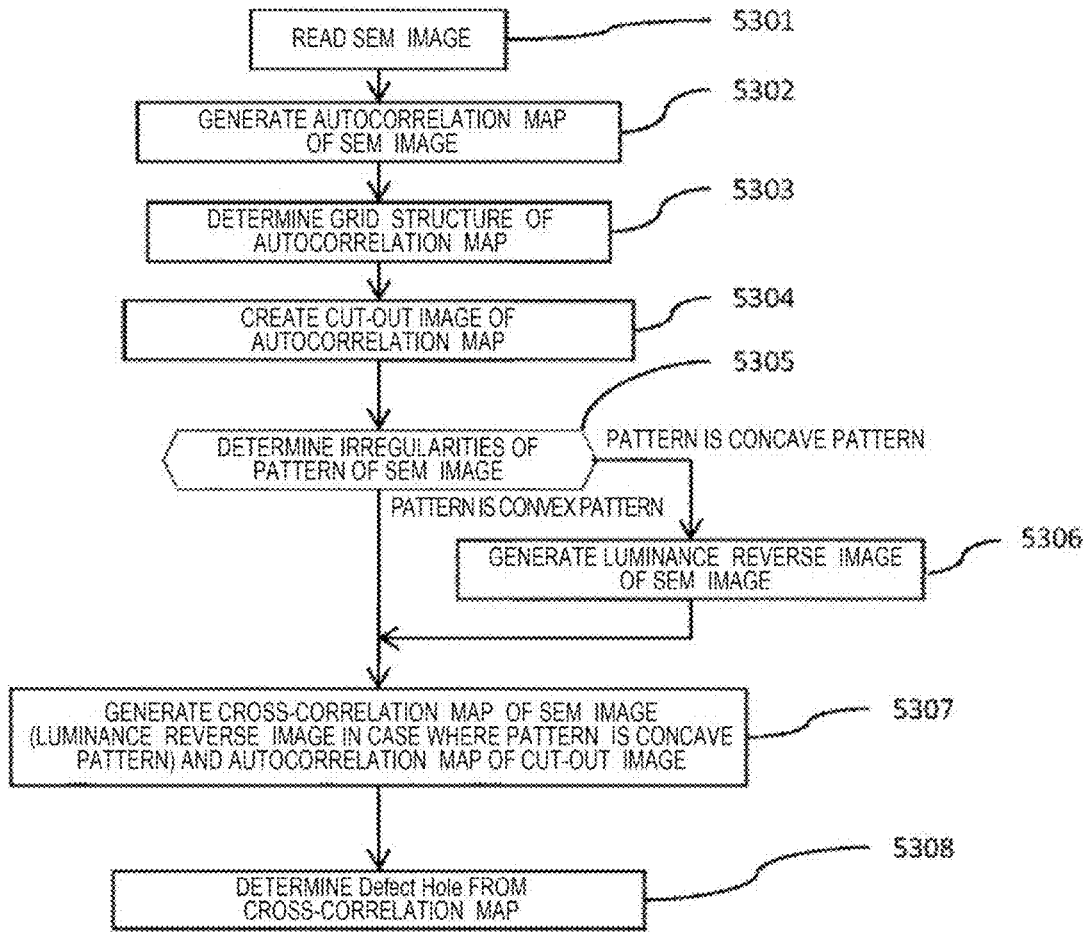
[Fig. 14]
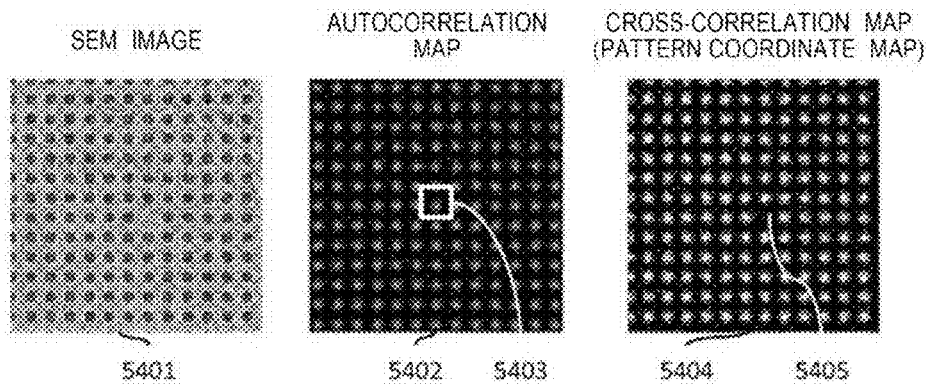

[Fig. 15]
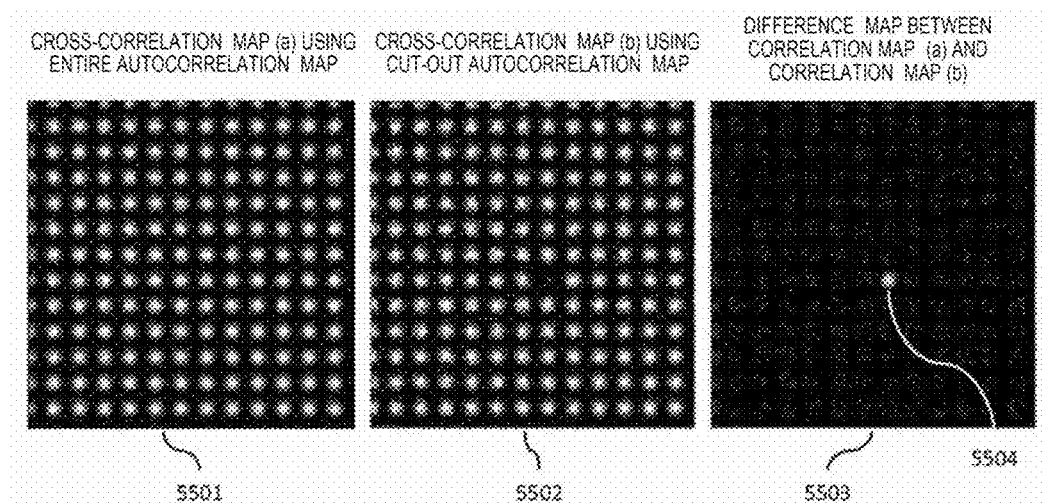
[Fig. 16]
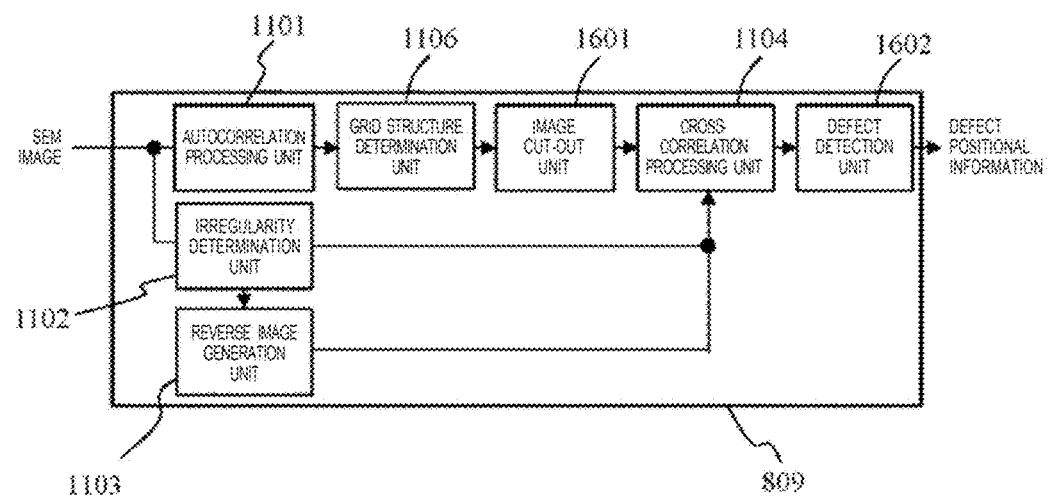

[Fig. 17]
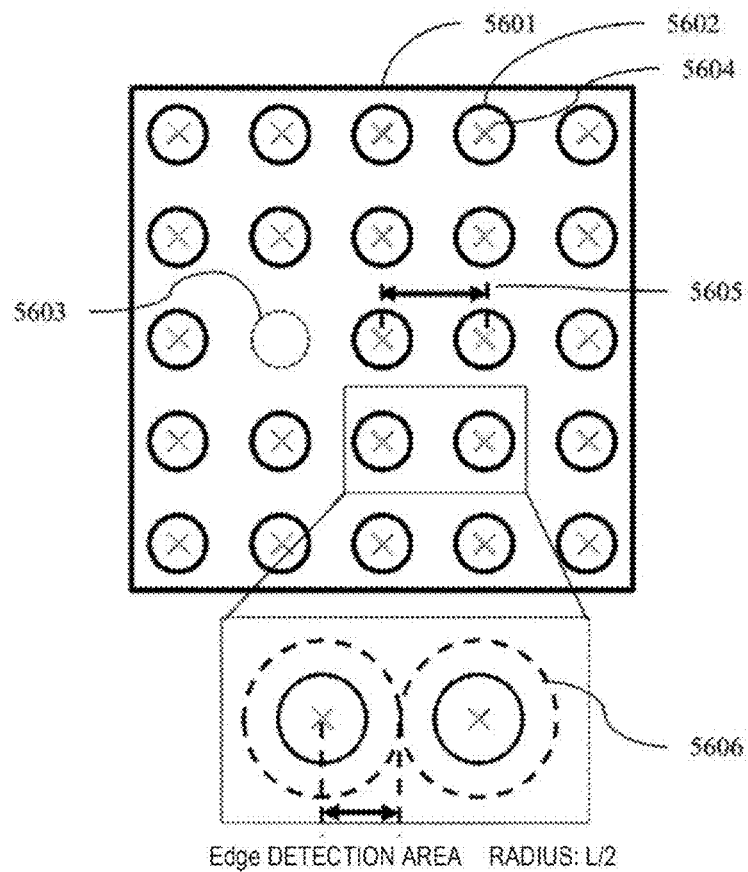
Edge DETECTION AREA    RADIUS: L/2
5601 SEM IMAGE
5602 Hole Pattern
5603 Defect Hole Pattern
5604 PEAK COORDINATES OF PATTERN COORDINATE MAP
5605 DISTANCE (L) BETWEEN PEAKS OF PATTERN COORDINATE MAP
5606 Edge DETECTION AREA

[Fig. 18]
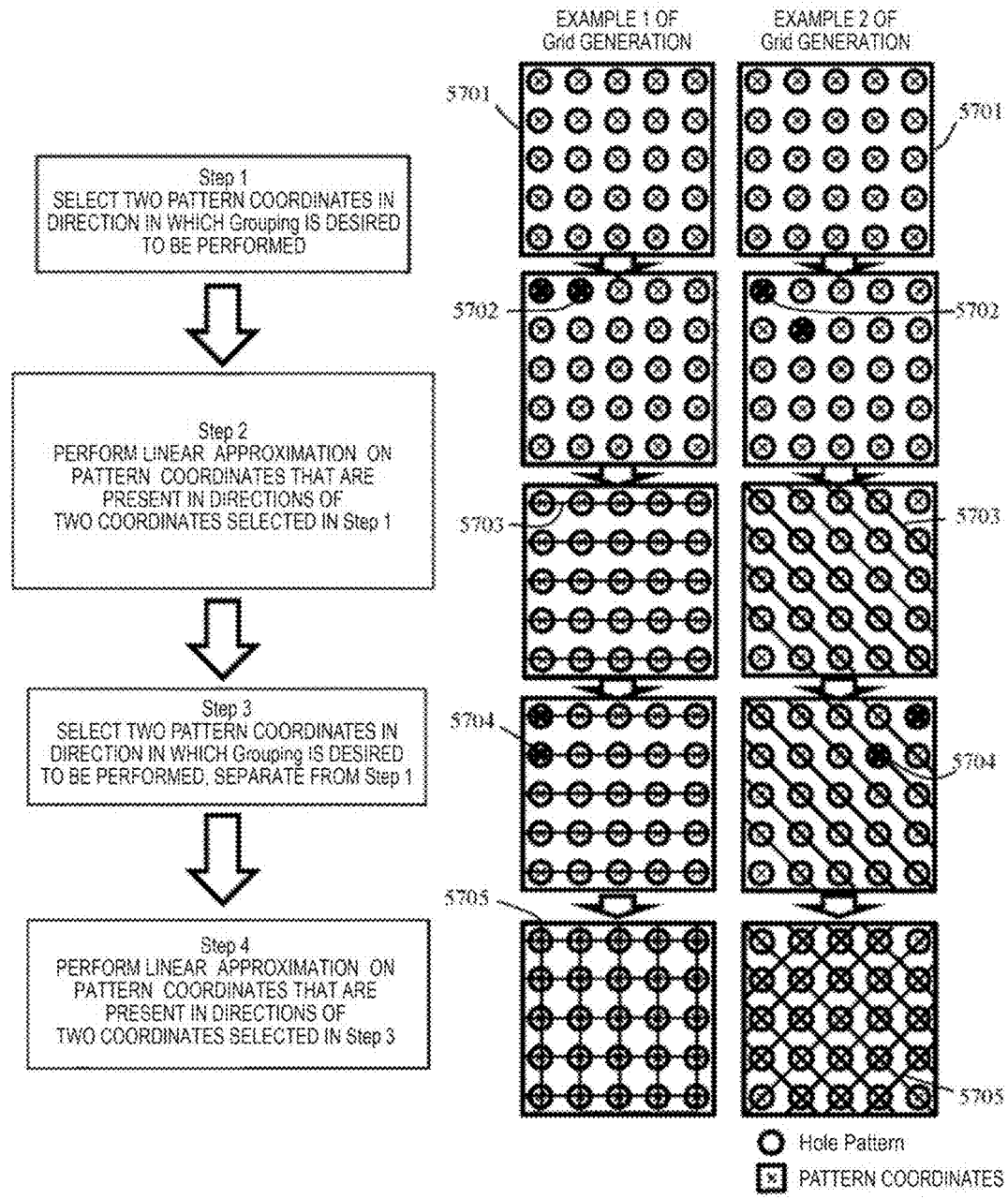

[Fig. 19]
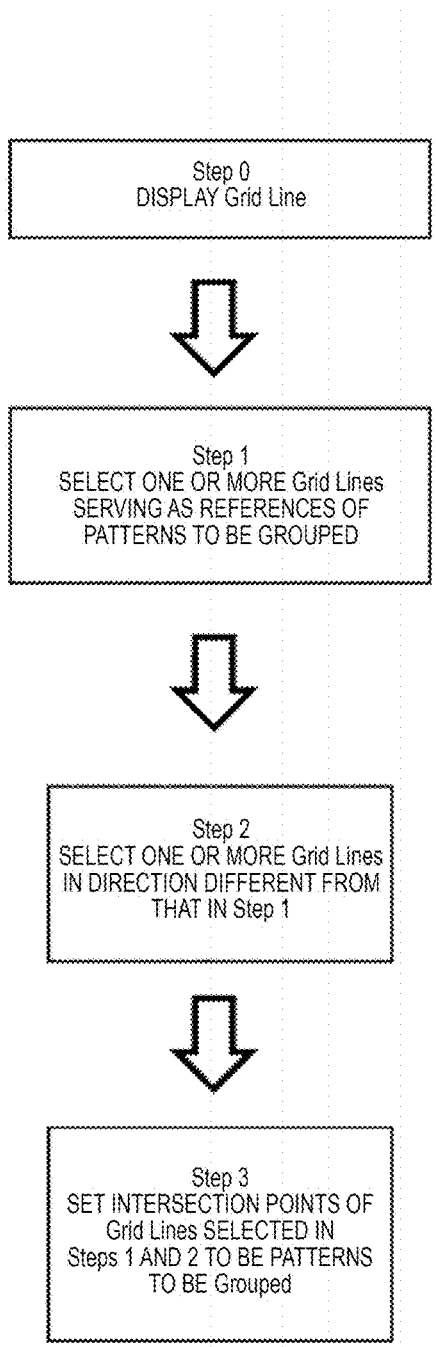
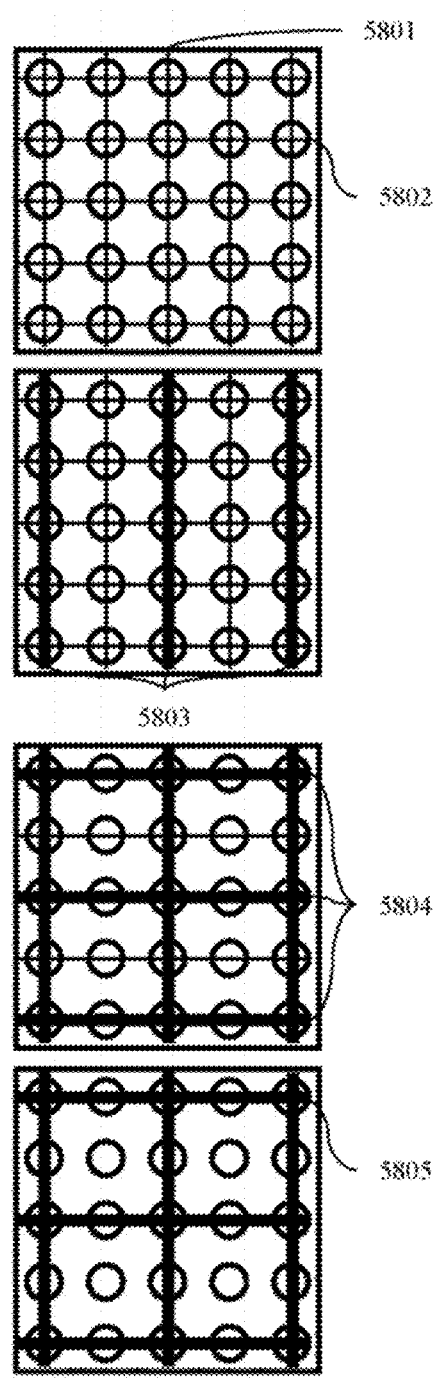
5801 SEM IMAGE
5802 Grid Line
5803 Grid Line SELECTED IN Step 1
5804 Grid Line SELECTED IN Step 2
5805 PATTERN TO BE MEASURED (INTERSECTION POINTS OF Grid Lines SELECTED IN Steps 1 AND 2)

[Fig. 20]
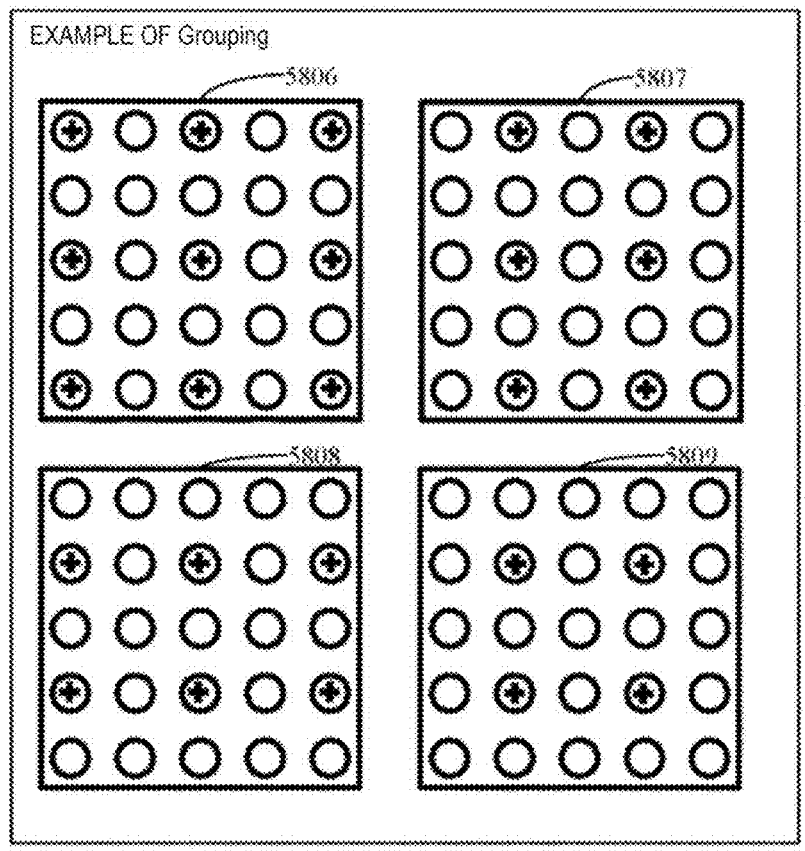
5806 MEASUREMENT LOCATION OF Grouping 1
5807 MEASUREMENT LOCATION OF Grouping 2
5808 MEASUREMENT LOCATION OF Grouping 3
5809 MEASUREMENT LOCATION OF Grouping 4

[Fig. 21]
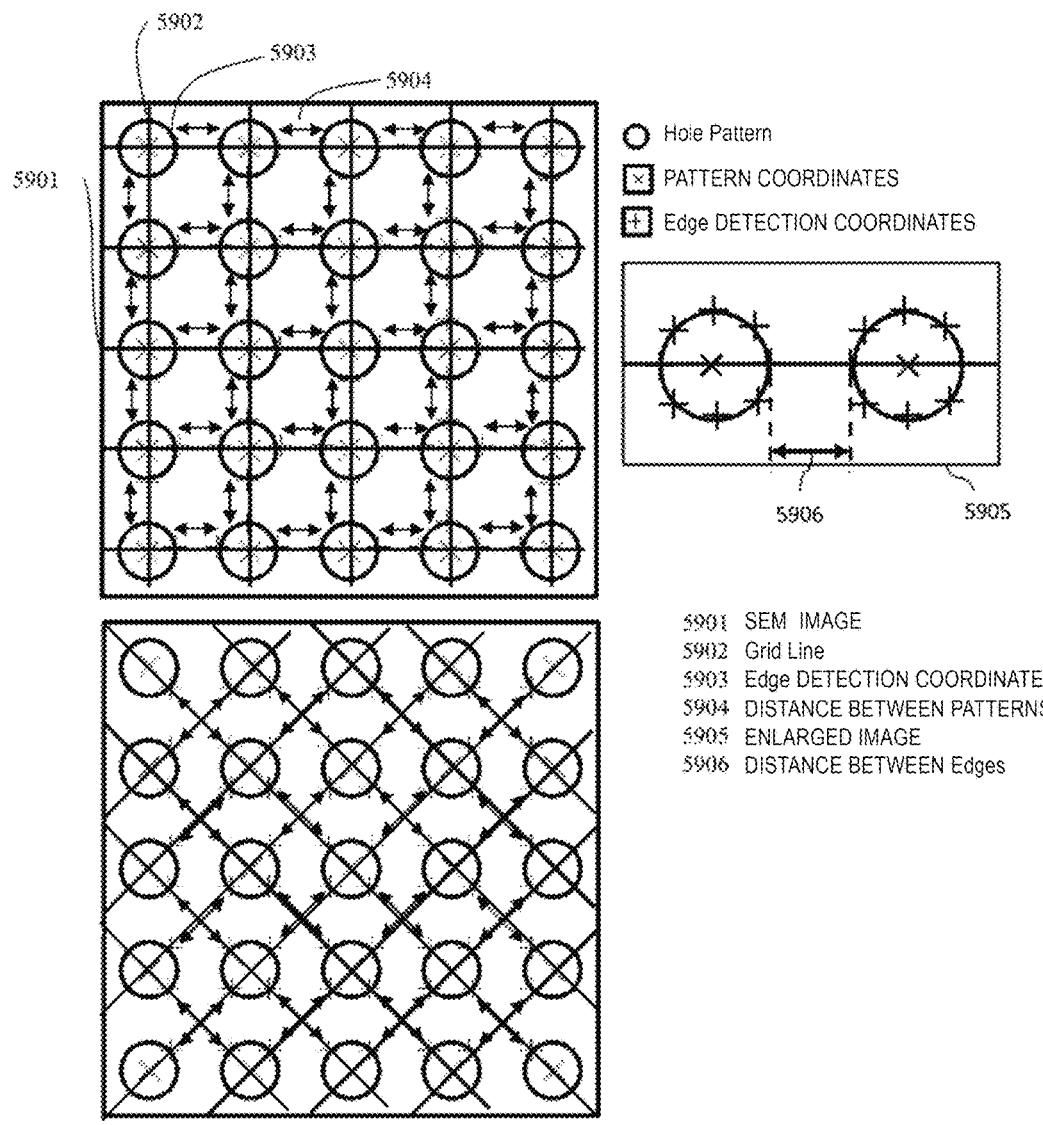

[Fig. 22]
Step 1
SELECT TWO Grid Lines SERVING AS REFERENCES OF
PATTERNS FOR WHICH DISTANCE IS CALCULATED
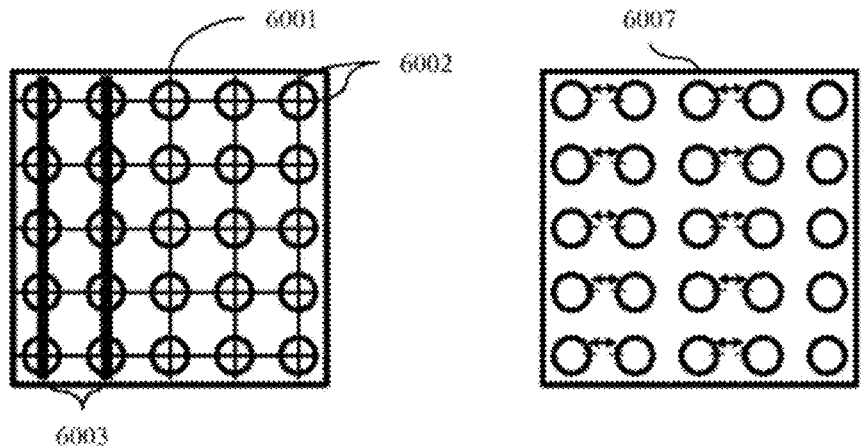
Step 2
SELECT ONE OR MORE Grids IN DIRECTION IN WHICH
DISTANCE IS CALCULATED
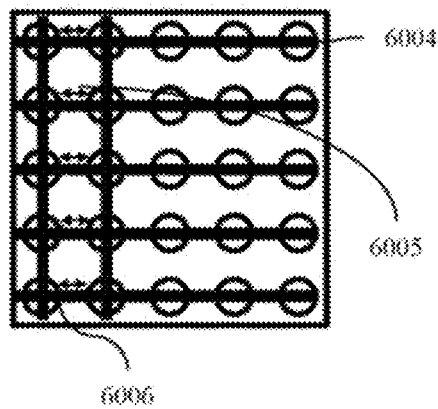
6001  SEM IMAGE
6002  Grid Line
6003  Grid Line SELECTED IN Step 1
6004  Grid Line SELECTED IN Step 2
6005  DISTANCE BETWEEN PATTERNS SELECTED IN Steps 1 AND 2
6006  PATTERN Edge COORDINATES
6007  EXAMPLE OF Grouping

[Fig. 23]
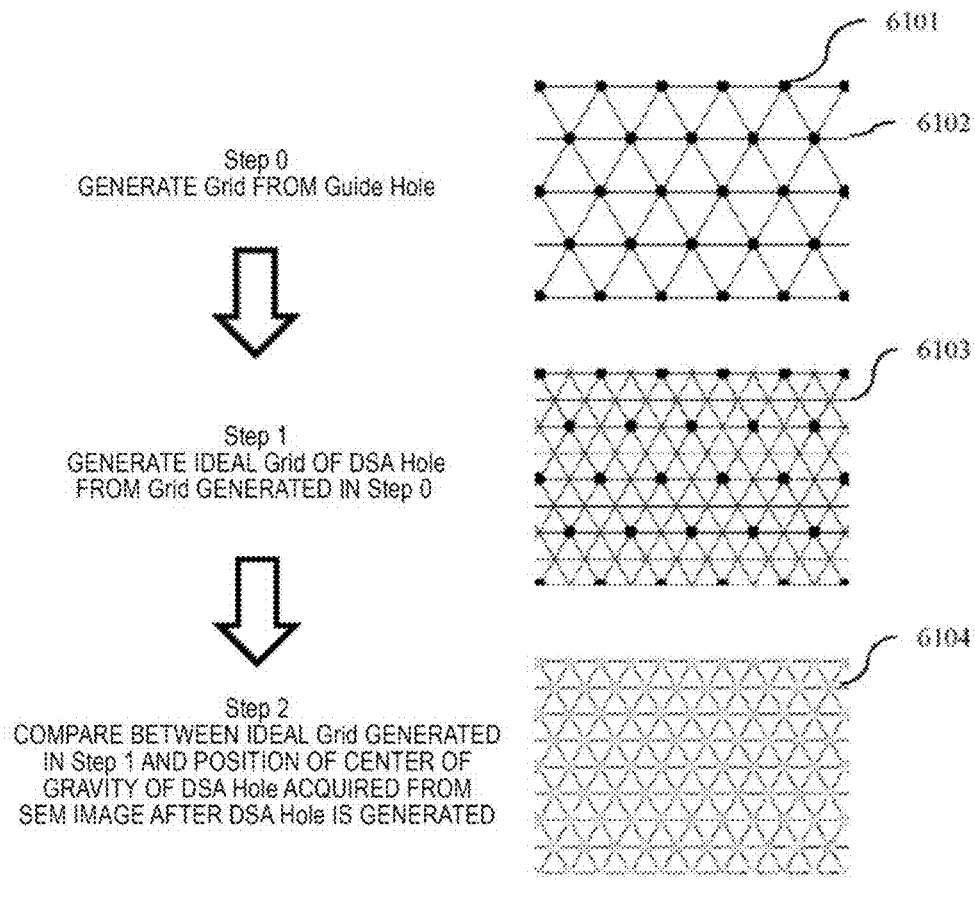

[Fig. 24]
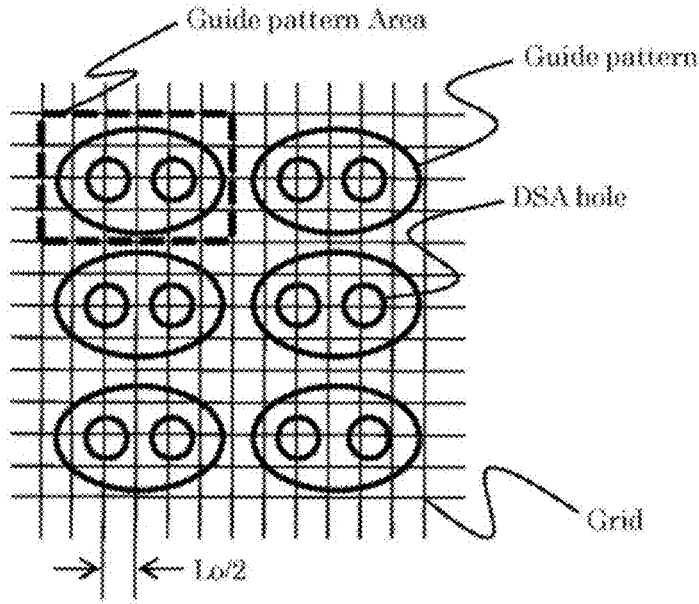
EXAMPLES OF GUIDE PATTERN AND
DSA HOLE PATTERN
[Fig. 25]
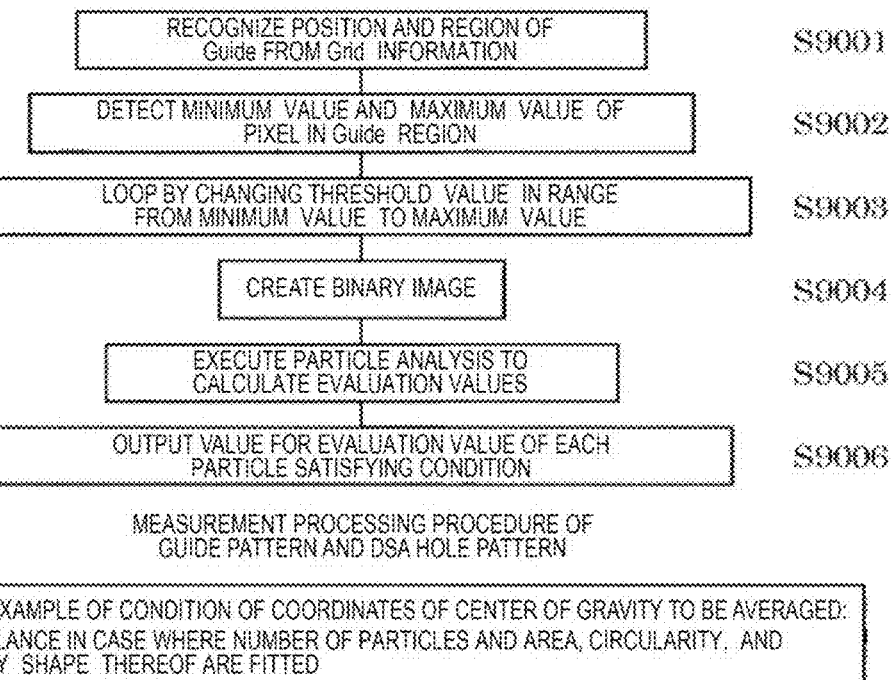
MEASUREMENT PROCESSING PROCEDURE OF
GUIDE PATTERN AND DSA HOLE PATTERN

[Fig. 26]
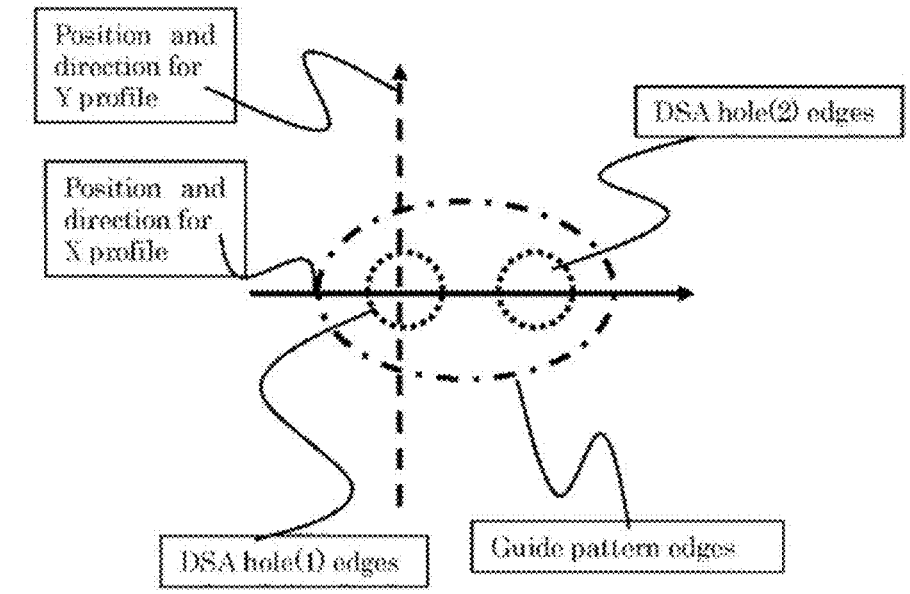
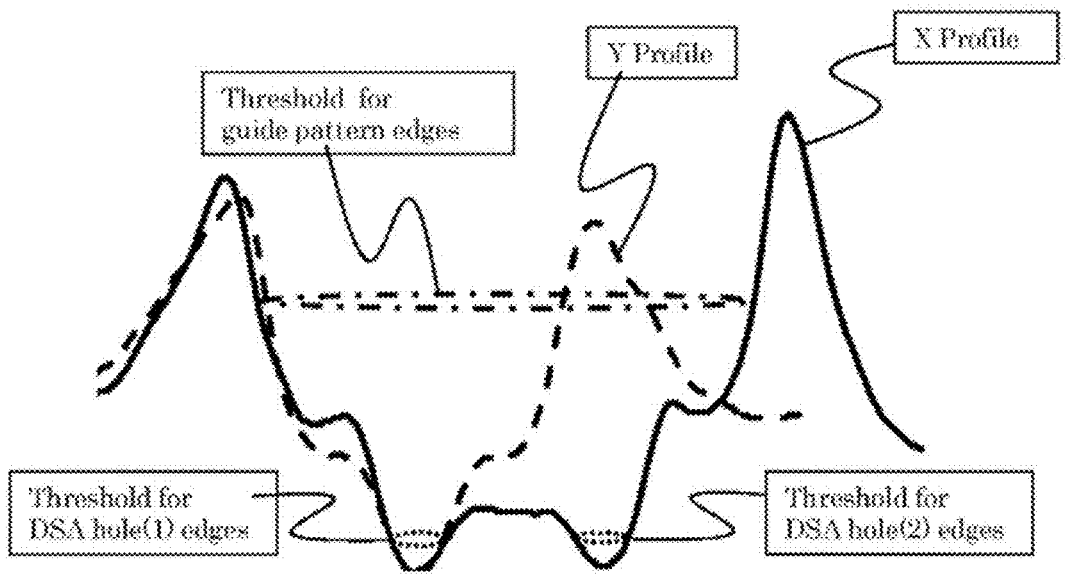
DIAGRAM ILLUSTRATING MEASUREMENT OF GUIDE PATTERN AND DSA HOLE PATTERN

[Fig. 27]
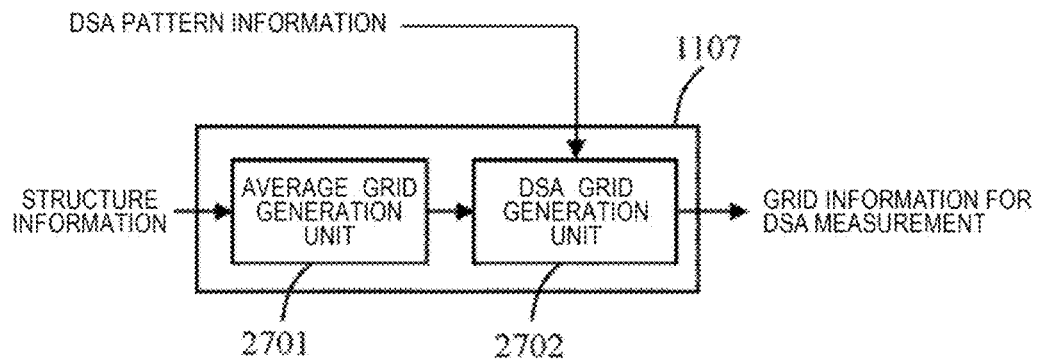
[Fig. 28]
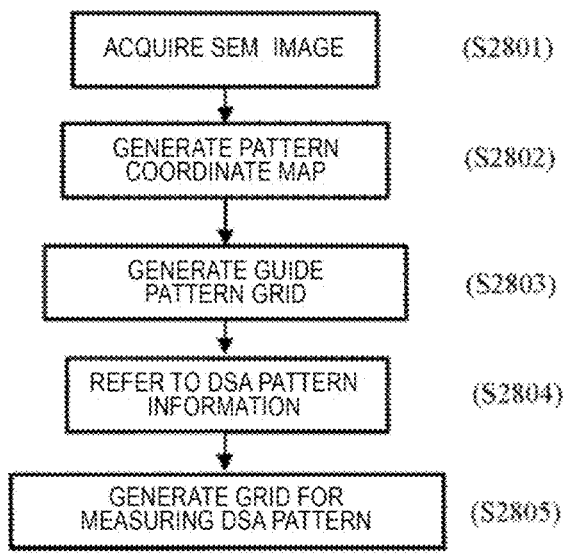

PATTERN MEASUREMENT APPARATUS AND DEFECT INSPECTION APPARATUS

TECHNICAL FIELD

The present invention relates to a pattern measurement apparatus and a computer program for pattern measurement, and more particularly, to a pattern measurement apparatus for performing the measurement of patterns uniformly arranged on design data, and a computer program.

BACKGROUND ART

Semiconductor devices have been made larger and highly integrated. Fine processing techniques support such progress. Among these techniques, a lithography technique has been advanced by a reduction in the wavelength of a projection exposure apparatus and an increase in NA of a projection lens. However, this technique also reaches the limit, and a half pitch of approximately 40 nm is the limit in a method using ultraviolet rays or far ultraviolet rays. As a method for solving the limit, a method using EUV rays has been developed. However, this method has not yet been to practical use. On the other hand, a pattern forming method making full use of various processing techniques and a new method using characteristics of a material have been developed.

One of the methods is a self aligned double patterning (SADP) method of doubling a pattern by self-alignment (NPL 1) or a self aligned quadruple patterning (SAQP) method of quadrupling a pattern. In this method, a material having a high etching tolerance is selectively left on the side wall of a pattern formed by lithography, the pattern formed by lithography is deleted, and the remaining side wall is used as a pattern. Therefore, one pattern can be doubled. When this step is repeated twice, the pattern can also be quadrupled. In other words, the pitch of the pattern can be reduced to ½ or ¼.

As a method of multiplying a pattern n times by using characteristics of a material, a method using a self-induced organizing process and directed self assembly (DSA) (NPL 2) is known. In this method, self-organizing is performed using a material obtained by synthesizing two types of polymers called polymeric block copolymers and performing block coupling thereon, and using a difference in thermodynamic characteristics between the two types of polymers. It is possible to form a plurality of patterns on the inner side of a pattern (guide pattern) formed by lithography and to form a fine hole on the inner side of a large-sized hole in a self-aligned manner.

On the other hand, PTL 1 discloses that a plurality of reference lines are superimposed on a contour image obtained by a scanning electron microscope image of a photomask, and measurement is performed using the reference lines.

CITATION LIST

Patent Literature

PTL 1: JP-A-2011-137901 (US Unexamined Patent Publication No. US2012/0290990)

Non-Patent Literature

NPL 1: H. Yaegashi, et al., "Novel approaches to implement the self-aligned spacer double-patterning process toward 11-nm node and beyond", Proc. Of SPIE, 832483241-M NPL 2: B. Rathsack, et al., "Pattern scaling with directed self assembly through lithography and etch process integration", Proc. Of SPIE, 83230B-1 (2012).

SUMMARY OF INVENTION

Technical Problem

According to the patterning methods as disclosed in NPL 1 and NPL 2, it is possible to form a fine pattern exceeding a limit determined according to the wavelength of a beam of a projection exposure apparatus. However, in the methods, steps and material which are different from those in a technique of the related art in which the shape of a pattern formed in a photomask is directly transferred onto a sample is used, and thus it is preferable to perform evaluation for the difference. NPL 1 and NPL 2 do not disclose such an evaluation method, and PTL 1 does not also disclose a method of evaluating a pattern which is not present in a photomask such as DSA, SADP, SAQP, and a self aligned octuple patterning (SAOP) method. In particular, a method of appropriately evaluating a sample in which the same patterns are continuously arranged is not disclosed.

Hereinafter, a pattern measurement apparatus for appropriately evaluating a pattern formed by a patterning method of forming a pattern which is not present in a photomask, and a computer program for pattern measurement will be described.

Solution to Problem

According to an aspect for accomplishing the above-described object, there is provided a pattern measurement apparatus including a processor that measures a dimension of a pattern formed in a sample by using data obtained by irradiating the sample with a beam, in which the processor extracts coordinate information of the pattern on the basis of the data obtained by irradiating the sample with a beam, and generates measurement reference data during the measurement of the dimension of the pattern by using the coordinate information.

According to another aspect for accomplishing the above-described object, there is provided a defect inspection apparatus including a processor that detects a defect on a sample by using data obtained by irradiating the sample with a beam, in which the processor detects the defect by comparing a first image obtained by irradiating the sample with a beam and a second image obtained by performing autocorrelation processing on the image with each other.

According to still another aspect for accomplishing the above-described object, there is provided a pattern measurement apparatus including a processor that measures a dimension of a pattern formed in a sample by using data obtained by irradiating the sample with a beam, in which the processor extracts pieces of coordinate information of a plurality of first patterns formed on the sample from the data of the sample, and generates measurement reference data during measurement of a second pattern formed between the first patterns.

Advantageous Effects of Invention

According to the above-described configurations, it is possible to generate reference data for appropriately evaluating a pattern formed by a patterning method of forming a pattern which is not present in a photomask, or to inspect a defect.

BRIEF DESCRIPTION OF DRAWINGS

FIG. 1 is a schematic diagram illustrating a scanning electron microscope.

FIG. 2 is a diagram illustrating an example in which the dimension and pitch of a pattern are measured.

FIG. 3 is a diagram illustrating an example in which a grid which is a measurement reference is disposed on an SEM image.

FIG. 4 is a flow chart illustrating a step of registering grid line information in an SEM image.

FIG. 5 is a flow chart illustrating a step of registering grid line information in design data.

FIG. 6 is a schematic flow chart illustrating a measurement procedure using a grid line.

FIG. 7 is a diagram illustrating an example (real FOV image of 200K times) of an SEM image of a DSA pattern.

FIG. 8 is a diagram illustrating an example of a measurement system including a scanning electron microscope.

FIG. 9 is a flow chart illustrating a step of generating measurement reference data.

FIG. 10 is a diagram illustrating examples of an autocorrelation map, a luminance reverse image, a cross-correlation map, and a pattern coordinate map of an SEM image.

FIG. 11 is a block diagram illustrating an example of a grid setting unit.

FIG. 12 is a diagram illustrating a grid structure determination table.

FIG. 13 is a flow chart illustrating a step of specifying a defect of a sample by using an SEM image.

FIG. 14 is a diagram illustrating an example of an intermediate result image used for processing for specifying the position of a defect.

FIG. 15 is a diagram illustrating an image of a difference between a cross-correlation map and a correlation map which are used for processing for specifying the position of a defect.

FIG. 16 is a block diagram illustrating an example of a grid setting unit having a defect detection function.

FIG. 17 is a diagram illustrating an example of an edge detection method.

FIG. 18 is a diagram illustrating a method of selecting a grid line.

FIG. 19 is a diagram illustrating a method of grouping measurement patterns.

FIG. 20 is a diagram illustrating an example of grouped images.

FIG. 21 is a diagram illustrating a method of measuring a distance between patterns.

FIG. 22 is a diagram illustrating a method of grouping results of distances between patterns.

FIG. 23 is a diagram illustrating a method of generating an ideal grid from a guide pattern of DSA.

FIG. 24 is a diagram illustrating an example of a guide pattern and a DSA hole pattern.

FIG. 25 is a flow chart illustrating a procedure of a process of measuring a guide pattern and a DSA hole pattern.

FIG. 26 is a diagram illustrating the measurement of a guide pattern and a DSA hole pattern.

FIG. 27 is a block diagram illustrating an example of a grid generation unit.

FIG. 28 is a flow chart illustrating a step of generating a grid for measurement of a DSA pattern.

DESCRIPTION OF EMBODIMENTS

New patterning methods such as DSA and SAxP can relatively simply achieve miniaturization, unlike a method of forming a pattern by general lithography. On the other hand, the methods have a feature that the shape of a pattern changes depending on variations in various processes and materials. In addition, simplification of a device pattern has also been advanced in adopting such techniques. As a representative design method, a gridded design method is known. This method is a method of making a device pattern linear as much as possible and disposing the linear apparatus pattern on a grid lined up, and is suitably applied to the SADP method and the DSA technique described above. In this manner, a great change has been made to a fine processing technique.

Examples to be described below are examples for realizing high-accuracy fine processing and the manufacture of a high-performance device by accurately capturing and measuring fluctuations in dimension in such latest pattern forming techniques.

On the other hand, in a measurement method using electron beams, an edge of a pattern to be measured is recognized from the distribution of intensities of secondary electrons or reflected electrons from the edge, an interval between a desired edge and the edge is obtained, thereby obtaining the dimension (critical dimension: CD), pitch, and the like of a pattern. When such measurement is performed, it is considered that a measurement position is selected by disposing reference lines with an edge, desired to be obtained, interposed therebetween and recognizing the edge from the distribution of intensities of internal secondary electrons sandwiched between the reference lines, and the like. However, it is necessary to set a reference line at an appropriate position based on the purpose of evaluation with respect to a pattern to be evaluated.

On the other hand, this example relates to a measurement technique in a manufacturing process for realizing an improvement in a manufacturing yield of a device in a semiconductor manufacturing process. In particular, this example relates to a dimension measurement method when using a so-called self-aligned pattern forming process of multiplying a pattern n times by using a process technique and material characteristics, and a measurement apparatus suitable for the method.

In pattern formation using general lithography, a mask pattern is transferred onto a wafer as a mask pattern by using a reduction projection exposure apparatus. In this method, the pitch of the pattern is guaranteed by the mask pattern, and thus the amount of error is extremely small and negligible. Therefore, the performance of pattern formation is evaluated mainly with regard to the dimension (critical dimension: CD) of a pattern. In addition, the management of an overlay margin which is an importance management item in the manufacture of a semiconductor can be performed in accordance with an alignment error between different layers and the management of the dimension (critical dimension: CD) of a pattern. However, in a case where a self-alignment process and the like are used, a side wall pattern of an atomic layer deposition (ALD) layer or the like, which is formed by self-alignment in the vicinity of a core pattern, is used as a pattern, in addition to a pattern formed by lithography which is called the core pattern. Therefore, a film thickness error of ALD or the dimension of a core resist pattern causes a fluctuation in a pattern position.

Therefore, a fluctuation in a process such as the formation of an ALD film causes not only a fluctuation in CD but also a fluctuation in a pattern position. In simple dimension measurement, CD measurement of a line width or interval of a pattern can be performed, but is not suitable for the measurement of a pattern position. That is, this is because there is no pattern capable of specifying a position within a measurement screen.

This example provides a method of collectively evaluating a CD fluctuation and a position fluctuation. Thereby, it is possible to evaluate positional information of a pattern edge also including a pattern position error, previously preventing the deterioration of device characteristics due to an overlay error, and to improve a device manufacturing yield.

In the measurement of this example, the position of the center of gravity or edge of a pattern is represented by the amount of deviation from a reference line or a reference point. Specifically, a plurality of reference lines or reference points are disposed in substantially the entire region within a CD-SEM measurement screen, the edges or centers of gravity of respective patterns and the reference lines are aligned, and then distances between the edges of the patterns and the reference lines or the reference points are measured. Regarding the reference lines or the reference points, it is possible to select between a method of automatically performing measurement and arrangement from an array of patterns to be measured and a method of inputting and displaying design values.

In addition, a method of disposing a measurement pattern for determining a reference pitch and position in addition to a pattern to be measured to obtain a pattern pitch based on the pattern and a method of obtaining the position of a reference line are also effective in improving the accuracy of measurement. In addition, it is also possible to add a function of correcting the distortion of a measurement screen. It is also possible to dispose a chip having a patter for correction formed therein within a measurement apparatus. In addition, a result of the measurement of the pattern for correction is applied to the correction of the screen distortion, and it is also possible to provide a function of disposing a reference line or a reference point in accordance with the screen distortion.

In this example, an apparatus suitable for the evaluation of a pattern formed by a self-aligned n-multiplication pattern forming method or a pattern forming method using a self-induced organizing material, and a computer program will be described. According to this example, it is possible to achieve improvements in the management of performance of pattern formation and the accuracy of dimension and position, and to greatly contribute to an improvement in a manufacturing yield and stability.

FIG. 1 is a block diagram illustrating an outline of a configuration of a scanning electron microscope. An overall control unit 125 controls the overall apparatus through an electronic optical system control apparatus 126 or a stage control apparatus 127 on the basis of an accelerating voltage of electrons which is input by a worker from a user interface 128, information regarding a wafer 111, observed positional information, and the like. The wafer 111 passes through a sample exchange chamber through a sample transport device not shown in the drawing, and is then fixed onto a stage 112 positioned in a sample chamber 113.

The electronic optical system control apparatus 126 controls a high-voltage control apparatus 115, a first condenser lens control unit 116, a second condenser lens control unit 117, a secondary electron signal amplifier 118, an alignment control unit 119, a deflection signal control unit 122, and an object lens control unit 121 in response to a command from the overall control unit 125.

A primary electron beam 103 drawn out from an electron source 101 by an extraction electrode 102 is converged by a first condenser lens 104, a second condenser lens 106, and an object lens 110, and is emitted onto the sample 111. The electron beam passes through a diaphragm 105 on the way, the track of the electron beam is adjusted by an alignment coil 108, and the sample is two-dimensionally scanned with the electron beam by a deflection coil 109 having received a signal from the deflection signal control unit 122 through a deflection signal amplifier 120. A secondary electron 114 discharged from the sample 111 due to the irradiation of the wafer 111 with the primary electron beam 103 is trapped by a secondary electron detector 107, and is used as a luminance signal of a secondary electron image display apparatus 124 through the secondary electron signal amplifier 118. Since a deflection signal of the secondary electron image display apparatus 124 and a deflection signal of the deflection coil are synchronized with each other, the shape of a pattern on the wafer 111 is reliably reproduced on the secondary electron image display apparatus 124. Meanwhile, an image processor 123 and the secondary electron image display apparatus 124 may be general-purpose computers or monitors. A storage apparatus 1231 is connected to the image processor 123, and it is possible to read out information registered therein as necessary. In order to create an image used for the measurement of dimension of a pattern, a signal which is output from the secondary electron signal amplifier 118 is subjected to AD conversion within the image processor 123 to thereby create digital image data. Further, a secondary electron profile is created from the digital image data.

A range of measurement from the created secondary electron profile is selected manually or selected automatically on the basis of a fixed algorithm, and the number of pixels in the selected range is calculated. A real dimension of an observation region scanned with the primary electron beam 103 and a real dimension on a sample from the number of pixels corresponding to the observation region are measured.

Meanwhile, in the above description, a scanning electron microscope using an electron beam has been described as an example of a charged particle beam apparatus. However, the invention is not limited thereto, and, for example, an ion beam irradiation apparatus using an ion beam may be used as an example. In addition, in the above description, an execution subject executing processing to be described later may also be referred to as a processor.

FIG. 8 is a diagram illustrating an example of a measurement system including a scanning electron microscope. This system includes a scanning electron microscope system constituted by an SEM main body 801, a control apparatus 802 of the SEM main body, and a processor 803. The processor 803 is embedded with a calculation processing unit 804 that supplies a predetermined control signal to the control apparatus 802 and processes a signal obtained by the SEM main body 801, and a memory 805 that stores obtained image information and recipe information. Meanwhile, in this example, a description will be given on the assumption that the control apparatus 802 and the processor 803 are configured as separate apparatuses, but the apparatuses may be an integrated control apparatus.

Electrons discharged from a sample by beam scanning based on a deflector or electrons generated by a conversion electrode are captured by a detector 806, and are converted into a digital signal by an A/D converter embedded in the control apparatus 802. Image processing corresponding to the purpose is performed by image processing hardware such as a CPU, an ASIC, or an FPGA embedded in the processor 803.

The calculation processing unit 804 includes a profile creating unit 807 that creates a waveform profile on the basis of a signal detected by the detector 806, and a measurement processing execution unit 808 that measures the dimension of a pattern on the basis of the waveform profile created by the profile creating unit 807 or on the basis of a signal waveform obtained by performing primary differential or secondary differential. In addition, as descried later, the measurement processing execution unit 8089 executes a process of measuring a dimension between a set grid and the center of gravity (may be the center in a case where the center of gravity and the center conform to each other). In this case, for example, a difference between coordinate values extracted in units of sub-pixels and/or the vector thereof may be set to be a measurement result. A pattern center-of-gravity calculation unit 810 extracts the position (coordinates) of the center of gravity of a pattern included in an SEM image from pattern data obtained on the basis of design data or simulation data, edge information of the pattern, and contour line data of the pattern which is extracted from the edge information of the pattern. As a method of obtaining the position of the center of gravity, the center of gravity may be obtained by creating a distance image on the basis of the position of an edge, for example, in a case of a circular pattern, and detecting a position farthest from an edge within a closed figure, or the center of gravity may be obtained by dividing a closed figure constituted by a polygon into a plurality of triangles, adding up the areas of the triangles and the centers of gravity, and dividing the added-up value by the total area.

An alignment processing unit 811 performs alignment between both pieces of data such that the position of the center of gravity of the pattern which is obtained on the basis of design data or pattern data of simulation data and the position of the center of gravity of the pattern which is obtained on the basis of edge data of the SEM image, and the like conform to each other. Meanwhile, in the examples to be described below, a description will be mainly given of an example in which alignment between the centers of gravity of a plurality of patterns is performed. However, in this case, alignment between both pieces of data is executed such that a total value of distances between the positions of the corresponding centers of gravity is minimized.

An alignment pattern selection unit 812 selects a pattern used for alignment (used for the extraction of the position of the center of gravity for alignment) on the basis of a predetermined reference. For example, in a case of the evaluation of a pattern formed by SAxP, when alignment is performed inclusive of other patterns, it is not possible to perform appropriate evaluation. Consequently, in order to automatically select a pattern for alignment based on the purpose of evaluation, the alignment pattern measurement unit 812 selectively reads out a region created by SAxP stored in a design data storage medium 814 on the basis of the purpose of measurement or information regarding a pattern to be measured which is input by an input apparatus 815, and registers the read-out region in the alignment processing unit 811 as an image for alignment. Alternatively, design data of a region including a pattern region created by SAxP and the other regions is read out, and a pattern formed by SAxP is selectively registered as an image for alignment.

The processor 803 executes specification and measurement of an edge or a pattern on the basis of measurement conditions or the like which are input by the input apparatus 815. In addition, the calculation processing unit 804 is embedded with a design data extraction unit 813 that reads out design data from the design data storage medium 814 in accordance with the conditions that are input by the input apparatus 815 and converts the design data from vector data into layout data as necessary, and the design data extraction unit 813 extracts information required for measurement to be described later from the design data.

Further, a GUI displaying an image, inspection results, and the like for an operator is displayed on a display apparatus provided in an input apparatus 2515 connected to a processor 2503 through a network.

Meanwhile, it is also possible to perform processing and control by allocating a portion or all of the controls and processes in the processor 803 to a CPU, an electronic computer mounted with a memory capable of storing images, or the like. In addition, the input apparatus 815 also functions as an imaging recipe creating apparatus that sets measurement conditions including coordinates of an electronic device, types of patterns, and imaging conditions (optical conditions or stage movement conditions) which are necessary for measurement, inspection, and the like, as an imaging recipe. In addition, the input apparatus 815 also has a function of collating coordinate information which is input and information regarding the type of pattern with layer information of design data and identification information of the pattern, and reading out necessary information from the design data storage medium 814.

The design data stored in the design data storage medium 814 is represented in a GDS format, an OASIS format, or the like, and is stored in a predetermined format. In addition, the type of design data does not matter as long as software displaying the design data can display the format thereof and the design data can be handled as figure data. In addition, the figure data may be line segment image information having been subjected to deformation processing for approaching to a real pattern, instead of being line segment image information indicating an ideal shape of a pattern formed on the basis of the design data.

In addition, the measurement system illustrated in FIG. 8 includes a photomask measurement SEM 516 for measuring the dimension of a pattern formed in a photomask. Measurement results, image data, and coordinate information, and the like of a photomask obtained by the photomask measurement SEM 516 are stored in the memory 805 of the processor 803, or the like. Photomask measurement SEM Example 1

In this example, a description will be given of a measurement method of evaluating a pattern by superimposing a grid serving as a reference line (point) on an image obtained by a scanning electron microscope (SEM). FIG. 2 is a diagram illustrating a measurement method of evaluating a pattern on the basis of measurement between edges. The position of a measurement pattern 201 on an image obtained on the basis of pattern positional information or pattern recognition which is registered in advance from a measurement pattern image 200 is determined. Next, the edge of the pattern is detected on the basis of positional information thereof, and a pattern CD 203 (pattern width) and a distance 204 between patterns are calculated on the basis of edge information. Meanwhile, the position of the measurement pattern on the image can be detected, for example, by template matching between a portion of the image which is cut out by a region designation cursor 205 and another pattern on the image. In such a measurement method, it is possible to perform relative measurement such as a line width or interval between patterns, but it is not clear whether or not respective patterns can be formed on target coordinates.

Consequently, this example proposes a measurement method in which a grid (measurement reference data) is superimposed on an SEM image (or a contour image obtained on the basis of the SEM image) and is set to be a reference (measurement starting point or measurement end point). FIG. 3 illustrates an example in which a grid is disposed on an SEM image. A grid arrangement screen 300 disposed on the secondary electron image display apparatus 124 is an image obtained by overlaying a reference line X 301 and a reference line Y 302 on the measurement pattern image 200. Meanwhile, the plurality of reference lines X and Y can be represented by any reference point 303, a pitch X 304, and a pitch Y 305.

An example in which a pattern is measured on the basis of the arrangement of a grid pattern will be described with reference to FIGS. 3 and 6. A measurement step using a grid includes a step of registering grid information (S600) and steps of executing grid measurement (S601 to S605).

When grid measurement is executed, grid information registered in advance is read to the image processor 123 or the processor 803 from the storage apparatus 1231 or the memory 805 (S601). The image processor 123 or the pattern center-of-gravity position calculation unit 810 of the processor 803 acquires a measurement pattern image (S602), and calculates e center of gravity 311 of a pattern from a pattern edge 310 obtained by the means described in FIG. 2. Various methods of calculating the position of the center of gravity are considered. However, for example, the center of gravity (the center) of the pattern may be obtained by extracting the edge of the pattern and then forming a distance image based on the edge of the pattern.

Next, a distance from a measurement reference point 312 which is one of intersection points between the plurality of reference lines X and Y is calculated, and an amount of deviation 313 is output. Similarly, the processes are performed on all of the patterns within a screen, and the reference point 303 is aligned such that the total of the amounts of deviation is minimized (S603). Here, in a case where patterns other than patterns formed by SAxP and patterns other than patterns formed by self-alignment are included within a visual field, alignment is performed by masking these patterns (not setting patterns other than a specific pattern to be targets for alignment), and thus it is possible to selectively evaluate patterns formed by SAxP or the like.

Meanwhile, it is considered that this process is not performed in a case where a reference pattern is present inside or outside a measurement screen and is aligned in advance. After the alignment, a reference line is disposed in the screen (S604), and relative positions of the reference line and the pattern are measured (S605). Similarly, it is also possible to output a pattern CD 203 at the same time by preparing a reference line corresponding to an edge point rather than the center of gravity. Grid line information can also be registered using an SEM image actually acquired, or can also be registered using design data of the pattern. In addition, since an interval between patterns is (may be) determined depending on the type of polymeric block copolymer, a database storing the polymeric block copolymer and the grid line information (interval between grid lines) in association with each other in advance may prepared, and the grid line information may be read out on the basis of the selection of the polymeric block copolymer to be used.

The interval between grid lines is set to be the same as an interval between patterns on the design data. Patterns formed by DSA or SAxP are formed to have the same interval (for example, equal intervals) as the interval between the grid lines when the patterns are ideally formed like the design data, but the interval may vary due to poor performance of a guide pattern or a fluctuation in a process condition (for example, a fluctuation in a film thickness of a layer serving as a mask layer). As described above, it is possible to obtain not only a simple deviation but also information sufficient for the ascertainment of a reason for the deviation by measuring dimensions between the positions of the centers of gravity of a plurality of patterns. This respect will be further described later.

FIG. 7 is a diagram illustrating an example in which a grid is disposed on an image in which patterns formed by a DSA method and guide patterns for applying the DSA method are displayed. The image illustrated in FIG. 7 is an image acquired at a magnification of 200K (visual field size of 670 nm☐), and a grid pattern 702 (reference pattern) is superimposed on the acquired image 701. It is possible to appropriately evaluate a self-induced organizing process by appropriately evaluating not only the sizes of patterns 704 arranged within the guide pattern 703 by a self-induced organizing phenomenon and but also the positions of the patterns formed. In addition, the guide pattern 703 is created on the basis of patterning performed by a reduction projection exposure apparatus, but the patterns 704 arranged within the guide pattern 703 may not be formed at appropriate positions depending on the performance of the guide pattern 703. Particularly, in a case where the edge of the guide pattern is deformed or the shape thereof is distorted, there is a possibility that the patterns are not arranged at appropriate positions.

In the example of FIG. 7, a guide pattern 705 for a reference pattern 706 is patterned together with the guide pattern 703, and the grid is set on the basis of the reference pattern 706. Meanwhile, in a case of this example, eight reference patterns are disposed within a visual field of an electron microscope. An interval between the eight reference patterns is set to be an integer times an interval between DSA patterns arranged within the guide pattern, and grid lines are set such that patterns formed by self-organization are positioned on the grid lines equally arranged between the reference patterns on design data. In this manner, it is possible to position the grid pattern at an appropriate position by appropriately setting the reference pattern conforming to the size of the DSA pattern.

A method of registering grid line information using an SEM image will be described with reference to FIGS. 4 and 5. The SEM image to be subjected to measurement is read to the image processor 123 or the processor 803 (S401). At this time, an image stored in the storage apparatus 1231 or the memory 805 in advance can be used as the SEM image. A user selects whether or not the position of a pattern is detected by automatic pattern recognition (S402). In a case where the automatic detection is selected, the image processor 123 or the alignment pattern selection unit 812 executes the automatic pattern recognition (S403), and calculates detected coordinates of the pattern (S410).

In general, since a semiconductor pattern is a pattern in which the same shape is repeated, it is possible to detect the position of the pattern by automatically recognizing the repetitive period by image processing or the like. In this example, the user determines the implementation of the automatic pattern recognition. However, this example can also be applied when measurement is executed, as long as it can be determined that recognition can be performed at this time. In a case where non-automatic detection is selected, the user designates a pattern region measured like 205 (S404). Meanwhile, as described above, a pattern formed by the DSA method may be selectively extracted from design data or simulation data so as to be set to be a template for pattern recognition (image for extracting the center of gravity of the pattern).

The image processor 123 or the processor 803 executes the detection of a pattern (S405), and calculates detection coordinates of the pattern, similar to the automatic pattern recognition (S410). Next, nearby patterns at a minimum distance from the detected pattern coordinate group are detected (S411).

A distance for minimizing the distance between the nearby patterns is calculated in the X-direction and the Y-direction, thereby determining a pitch. Other pitch calculation methods to be considered include a method of obtaining a pitch according to a distance between peaks from projection waveforms in the X- and Y-directions and a direction in which a pattern is present, a method of calculating a pitch by spatial frequency analysis, a method of calculating a pitch by a self-regression model, and the like.

Coordinates of a temporary grid line are generated together with the calculation of the pitch (S412). The measurement of the pattern is executed, and CD and coordinates of the center of gravity of the pattern are obtained from a group of edge points detected during the measurement (S413). The temporary grid line is corrected by using the coordinates of the center of gravity of the pattern. In addition, the coordinates of an auxiliary grid line are generated by CD of the pattern at the same time, and are displayed on the secondary electron image display apparatus 124 (S414).

In a case where a reference pattern is not present, the processing proceeds to confirmation (S425), and the processing is terminated. In a case where the reference pattern is present, a reference pattern region is designated (S421), or a reference line is designated (S422). In a case where the reference line is designated, the coordinates of the center of gravity of the reference pattern are detected, and recalculation is performed. The grid line, the auxiliary grid line, and the reference line are corrected on the basis of recalculated information and are displayed on the secondary electron image display apparatus 124 (S424).

Meanwhile, in the above-described example, a method of creating a reference pattern separate from a pattern to be measured and evaluating a positional deviation of the pattern to be measured on the basis of alignment using the reference pattern has been described as one configuration. A plurality of patterns included in a guide pattern which is set so as to form one DSA pattern (hole pattern) are formed as compared to a pattern included in a guide pattern which is set so as to form a plurality of hole patterns, and thus do not cause a deviation. Accordingly, it is possible to appropriately evaluate a deviation occurring due to a specific cause (a case where a plurality of patterns are included within the guide pattern). In addition, alignment is performed using a plurality of reference patterns, and thus it is possible to average deviations of individual patterns and to consequently perform the alignment with a high level of accuracy.

Meanwhile, even when alignment is performed on the basis of the center of gravity of a pattern to be measured, a plurality of patterns are set to be targets for alignment, and thus it is possible to make a pattern relatively greatly deviated from the other patterns apparent.

In addition, patterns included within a plurality of guide patterns are set to be targets for alignment, and thus it is possible to make a deviation caused by the performance of the guide patterns apparent.

As described above, measurement reference data such as a grid line is generated in advance, and evaluation is performed on the basis of the data, whereby it is possible to appropriately evaluate good or poor performance of, particularly, a DSA pattern. It is considered that such measurement reference data is generated from, for example, design data (layout data). However, for example, in a case where the performance of a guide pattern is different from that of the design data and the DSA pattern is not appropriately formed, the data may not be appropriate as a measurement reference for appropriately evaluating variations and the like caused by the good or poor performance of the edge of the guide pattern. In other words, it is considered that the data is not suitable for a measurement reference in a case where there is an attempt to selectively evaluate variations of the DSA pattern, and the like.

Consequently, in this example, a method of specifying the location of a pattern within an image of a repetitive pattern obtained by an SEM from the image and a method of automatically generating a grid of the pattern have been described. FIG. 9 is a diagram illustrating a process of specifying the coordinates of a pattern. In addition, FIG. 10 is a conceptual diagram illustrating a processing flow of FIG. 9. FIG. 11 is a block diagram illustrating details of a grid setting unit 809 generating measurement reference data along processing steps of FIG. 9.

First, the grid setting unit 809 reads an SEM image 5101 (S5001), and an autocorrelation processing unit 1101 creates an autocorrelation map 5102 of the read SEM image (S5002). In the autocorrelation map obtained here, a correlation value is maximum on the coordinates of the center of the map, and an interval between peaks is substantially the same as an interval between pattern pitches in the SEM image. More specifically, the search of the image is performed using the same image as the image, thereby creating a map in which a portion having a large correlation value is set to have relatively high luminance.

Next, an irregularity determination unit 1102 determines irregularities of a pattern of the SEM image (S5003). Regarding the determination of the irregularities, the image is simply binarized by Otsu's binarization or the like, and a side having a smaller area can be determined to be a pattern portion. In a case where the area of a low luminance side is small, that is, the pattern is a concave pattern, a reverse image generation unit 1103 generates a luminance reverse image 5103 obtained by reversing the luminance of the SEM image (S5004).

Next, a cross-correlation processing unit 1104 generates a cross-correlation map (S5106) of the autocorrelation map and the SEM image (luminance reverse image in a case where the pattern is a concave pattern) (S5005). The cross-correlation map can be obtained by a normalization cross-correlation method, the sum of absolute values of differences in luminance value, the sum of squares of the differences in luminance value, or the like. A peak coordinate 5105 of the cross-correlation map obtained in this manner indicates the coordinates of substantially the center of the pattern in the SEM image. It is possible to generate a pattern coordinate map by detecting a peak position of the cross-correlation map by a peak detection unit 1105 (S5006).

Next, a grid structure determination unit 1106 performs a process of determining a grid structure of the SEM image (S5007). Three adjacent points on a peak map in which the peak position of the autocorrelation map is detected or the pattern coordinate map are selected so as not to have a linear shape and to minimize the area of a triangle formed by three points, and the grid structure is determined in accordance with the shape of a triangle having three points as vertexes. As in FIG. 12, the grid structure is determined to be a hexagonal grid in a case where the triangle is an equilateral triangle having equal sides, to be a square grid in a case where the triangle is a right angle isosceles triangle, to be an orthorhombic grid in a case where the triangle is an isoceles triangle, to be a rectangular grid in a case where the triangle is a right triangle, and to be a parallel body grid in other cases.

Subsequently, a grid generation unit 1107 generates an average grid after the above-described determination process (S5008). In the cases of the hexagonal grid, the orthorhombic grid, and the parallel body grid, an average distance between adjacent points in point sequences arranged in parallel with the respective sides of the triangle is obtained. In the case of the square grid and the rectangular grid, an average distance between points adjacent to each other in directions respectively parallel to two sides intersecting each other at a right angle of three points used for the determination of the grid is calculated. In this manner, an average grid is created from the obtained average distance. The grid generation unit 1107 creates a grid in which a distance between each coordinate of the pattern coordinate map and each point of the average grid is minimized, after the average grid is calculated (S5009). By these processes, it is possible to specify the position of the pattern on the SEM and to generate a grid structure of the SEM image and an average grid on the pattern of the SEM image.

Example 2

Next, a process of determining a defect of a pattern in an SEM image will be described with reference to FIGS. 13, 14, 15, and 16. Meanwhile, in this example, an example in which the grid setting unit 809 is equipped with a defect detection function will be described. However, the invention is not limited thereto, and a different processor executing the detection of a defect may be provided.

First, the grid setting unit 809 reads an SEM image 5401 (S5301), and creates an autocorrelation map 5402 of the SEM image by the autocorrelation processing unit 1101 (S5302). Subsequently, a grid structure of an autocorrelation map is determined by the grid structure determination unit 1106 (S5303). The determination of the structure can be performed by detecting a peak position of an autocorrelation map and using the process of determining a grid structure described in Example 1. After the grid structure is determined, a cut-out image 5403 of the autocorrelation map is created by an image cut-out unit 1601. A cut-out region may be set to be a region (for example, a half pitch) which does not overlap an adjacent pattern because a pattern pitch can be calculated from the determination of the structure.

Subsequently, the irregularity determination unit 1102 determines irregularities of a pattern of the SEM image in order to create a cross-correlation map (S5305). When the pattern is a concave pattern, the reverse image generation unit 1103 generates a luminance reverse image of the SEM image (S5306). In the next process, the cross-correlation processing unit 1104 creates a cross-correlation map 5404 of an autocorrelation cut-out image and the SEM image (luminance reverse image in a case where the pattern is a concave pattern) in order to specify the position of a defect of the SEM image (S5307).

The cross-correlation map can be obtained by a normalization cross-correlation method, the sum of absolute values of differences in luminance value, the sum of squares of the differences in luminance value, or the like. In the cross-correlation map calculated here, a peak is present on the pattern of the SEM image, and a peak does not appear with respect to a defect position (5405) at which the pattern is not present. Accordingly, the defect detection unit 1602 specifies the defect position by detecting locations that are not periodically arranged from the cross-correlation map (S5308).

The locations that are not periodically arranged can be specified by a method of performing Hough transformation and determining whether or not a peak of the cross-correlation map is present on an intersection point between linear components, and can also be specified by a method of detecting peaks of the cross-correlation map and determining whether or not adjacent peaks are present by the amount of structure of the pattern. Further, the locations can be specified by a method of creating a difference map 5503 by a difference between a cross-correlation map 5501 of the entire autocorrelation map and the entire SEM image and a cross-correlation map 5502 of an image obtained by cutting out the autocorrelation map and the entire SEM image and detecting a defect position 5504. In this method, a peak 5504 appears at the defect position in the difference map, and thus it is possible to specify the defect position by detecting the peak.

Example 3

In this example, a method of detecting a pattern edge by using peak coordinates of the cross-correlation map (pattern coordinate map) generated in the above-described example will be described with reference to FIG. 17. First, a minimum distance 5605 between coordinates 5604 of the pattern coordinate map is calculated, and a range 5606 in which edge detection is performed is set. When an edge detection range is set to be half a minimum distance between cross-correlation peaks, it is possible to set a region which is not covered with an adjacent pattern. Alternatively, it is also possible to set an edge detection range in advance. Next, the peak coordinates of the pattern coordinate map which are generated above are set to be a measurement reference position 5604 (edge detection is not performed at a position determined to be a defect), and edge detection of a pattern is performed within the edge detection range. As a method of detecting an edge, it is possible to detect the edge by providing a threshold value between a minimum luminance and a maximum luminance which are obtained from the SEM image. The threshold value can be automatically calculated by Otsu's binarization or the like, and it is also possible to set a luminance threshold value in advance from the outside. In addition to the threshold value, it is possible to radially acquire a luminance profile from the peak coordinates of the pattern coordinate maps and to set a location at which a differential peak of the luminance profile is maximized to be an edge position. Next, it is determined whether or not the edge detection is successful. In a case where the determination is performed by binarization, it is possible to determine whether or not a closed curve is generated within the edge detection range. In a case where the edge detection is performed by radially acquiring the luminance profile, a differential peak value of the luminance profile is present in each direction within the edge detection range, and it is determined that the edge detection is successful when a variation in edge is within a predetermined range.

Regarding the pattern succeeding in the edge detection, the center of gravity of each pattern edge is obtained from an edge detection result, and a distance between the center of gravity of the edge of each pattern and the corresponding coordinate in the pattern coordinate map is calculated, whereby it is also possible to calculate a variation in the center of gravity of the pattern.

Example 4

In this example, a method of generating grid data in any direction in accordance with an array of patterns from the pattern coordinate map generated above will be described. FIG. 18 is a flow chart illustrating steps of generating a grid. Necessary data is a pattern coordinate map 5701 described in the above-described example. First, in Step 1, at least two coordinates of a pattern in a direction in which grouping is desired to be performed are selected from the pattern coordinate map 5701. The coordinate map as illustrated in FIG. 18 is displayed on a display apparatus of the input apparatus 815 illustrated in FIG. 8, and pattern coordinates 5702 are selected using a pointing device not shown in the drawing, or the like.

In Step 2, linear approximation is performed from a pattern coordinate point sequence in the vicinity of a straight line passing through the selected two pattern coordinates, thereby generating an approximate straight line 5703. Further, linear approximation is performed on pattern coordinates arranged in parallel with the approximated straight line. In Step 2, it is also possible to calculate the straight line on the basis of an inclination of the straight line passing through the selected two pattern coordinates and by performing Hough transformation on the pattern coordinate map. In Step 3, two pattern coordinates 5704 in directions different from the directions of the coordinates selected in Step 2 are selected. In Step 4, linear approximation is performed, similar to Step 2. It is possible to generate a grid line 5705 in any direction by this method.

Example 5

In this example, a method of grouping feature amounts such as the dimension size of a measurement pattern by using grid line information will be described with reference to FIG. 19. First, in Step 0, grid lines 5801 and 5802 created using the method described in the above-described example, or the like are plotted on an SEM image. In Step 1, one or more grid lines 5803 serving as references of patterns to be grouped are selected. Next, in Step 2, one or more grid lines 5804 in a direction different from that in Step 1 are selected. Finally, in Step 3, intersection points 5805 of the grid lines selected in Step 1 and Step 2 are set as patterns to be grouped. When the patterns designated by 5805 are shifted by one pattern cycle, it is possible to perform division into four groups as in a grouping image 5806 illustrated in FIG. 20. In addition, as illustrated in FIG. 20, group division as in grouping images 5807 to 5809 may be performed by setting a reference grid line on other pattern coordinates.

Example 6

In this example, a method of calculating a minimum distance between edges of patterns will be described. As illustrated in FIG. 21, a minimum distance between edges of patterns is calculated using grid line information which is set using the method described in the above-described example, or the like. Specifically, it is possible to obtain a distance between patterns by calculating distances 5904 between a plurality of adjacent edges that are positioned on grid lines 5901 and 5902 and calculating a distance 5906 between combinations of the shortest edges as a result of comparison between the calculated plurality of distances 5904. In addition, it is also possible to calculate not only a distance between the edges of the patterns but also a distance between the centers of gravity of the patterns by using the grid lines.

Example 7

In this example, a method of grouping and calculating distances between patterns. As illustrated in FIG. 22, first, two grid lines 6003 serving as references in Step 1 are selected using grid lines 6002 created using the method described in the above-described example, or the like with respect to an SEM image 6001. In Step 2, one or more grid lines 6004 in the same direction as a direction in which a distance is calculated are selected. By this step, it is possible to determine a combination of distances 6005 between patterns to be grouped. In addition, the combination of the patterns which is determined in this step is moved in parallel, and thus it is also possible to designate a distance 6007 between patterns in an adjacent array in the same grouping manner.

As described above, grid lines are set in advance on an SEM image, and thus it is possible to collectively set measurement positions without individually setting measurement positions with respect to a plurality of patterns desired to be measured or distances between the patterns.

Example 8

In this example, a method of generating grid lines used when measuring a pattern formed by DSA will be described. FIG. 23 is a diagram illustrating a measurement method using a grid for measuring a DSA pattern. FIG. 27 is a diagram for more specifically describing the grid generation unit 1107 illustrated in FIG. 11, and illustrates the grid generation unit for generating grid information by using DSA pattern information. FIG. 28 is a flow chart illustrating steps of generating a grid for measuring a DSA pattern on the basis of the acquisition of an SEM image.

First, a sample having a guide pattern (guide hole) formed therein is scanned with an electron beam, thereby acquiring an SEM image of the guide pattern (step 2801). The sample to be scanned with the electron beam is a sample before a polymer for forming a DSA pattern is applied. An average grid generation unit 2701 generates a guide pattern grid 6102 on the basis of the grid generation method described in the above-described example or the like (step 0 of FIG. 23 and steps 2802 and 2803 of FIG. 28).

Next, a DSA grid generation unit 2702 generates a DSA pattern measurement grid 6103 with reference to DSA pattern information which is stored in the memory 805 or the like or is input from the input apparatus 815 (step 1 of FIG. 23 and steps 2804 and 2805 of FIG. 28). A guide pattern generated by lithography is generated with a high level of accuracy, and thus it is possible to define a grid generated by a DSA Hole by using a guide grid as an ideal grid in Step 1. When the guide pattern is a hexagonal grid, the DSA Hole is generated at a location of the half pitch thereof, and thus it is assumed that the ideal grid is located on the half pitch of the guide pattern. Such information can be acquired in advance from the type of polymer used in the DSA pattern, manufacturing conditions, and the like, and thus it is possible to register the information in a storage medium or the like in advance and to automatically generate a grid for measurement which is one of the measurement conditions of the DSA pattern on the basis of the above-described generation method.

The guide pattern displayed in the SEM image has a shape of a real pattern rather than an ideal shape of such as design data. Since a DSA pattern measurement grid formed by the above-described method indicates an ideal position of the DSA pattern in a state where a real guide pattern is formed, it is possible to perform appropriate evaluation based on the performance of the guide pattern.

In Step 2 of FIG. 23, center-of-gravity coordinates 6104 of patterns are obtained from the SEM image of the DSA pattern obtained on the basis of the scanning of the sample with the electron beam after the DSA pattern is generated, and comparison with the ideal grid is performed, thereby calculating a deviation of the center of gravity from ideal coordinates. In addition, when grouping is performed for each grid line, it is possible to calculate variations in the patterns for each direction, a variation in the angle of an array of the patterns, and the like.

Example 9

In this example, a method of measuring a DSA pattern formed using the generated grid information will be described. A resist guide pattern resolved after being exposed on a substrate or a guide pattern formed by etching, and a hole pattern formed in a DSA step are illustrated in FIG. 24. In the DSA step, it is possible to control the size and pitch (hereinafter, referred to as Lo) of the pattern in accordance with the size of a guide and a component ratio of two types of polymers.

In this example, an example in which a component ratio of two types of polymers is of 1:1 and Lo/2 (approximately a diameter of a hole) is set to be a minimum width of the grid is described. However, this value can be set in accordance with Lo, the size of the DSA hole pattern, and the shape of the guide pattern. Here, an example in which the pitch of the generated grid which is divided into two parts is used will be described.

The detection of the positions of two DSA hole patterns formed within a DSA guide pattern and a measurement procedure will be described with reference to a flow chart illustrated in FIG. 25. Examples of an X-direction waveform and a Y-direction waveform extracted so as to pass through the center of one DSA hole pattern are illustrated in FIG. 26. Although the Y waveform in the vicinity of the center of the DSA hole has a substantially symmetrical shape in a horizontal direction, the X-direction waveform has an asymmetrical shape, and a signal of the other DSA hole pattern is lowered. Since it is difficult to determine the edges of patterns having different signal intensities depending on such edge direction by a fixed threshold value, a threshold value is determined from evaluation values of the shapes of the guide pattern and the DSA hole which are obtained by changing the threshold value. A measurement value of each pattern is calculated from the determined threshold value.

Hereinafter, a processing procedure will be described. First, the position and region of a guide pattern are recognized from grid information (S9001). The region may be recognized as a portion having a value equal to or less than a threshold value registered in advance, and may be recognized by template matching. A minimum value and a maximum value of a pixel within the recognized guide region are detected (S9002), and the threshold value is changed in a range from the minimum value to the maximum value (S9003), thereby creating a binary image (S9004). Particle analysis is executed using the threshold values to calculate evaluation values such as the number of particles and the areas thereof (S9005). In a case where a plurality of particles are detected, evaluation values are calculated with respect to all of the particles. Coordinates are calculated for a position at which coordinates of the center of gravity or any shape (an elliptical shape, a circular shape, or the like) of a particle satisfying a condition determined in advance or a condition which is input are fitted (S9006). A value which is output at this time may be an average value in all cases satisfying the condition, or may be a value obtained by multiplying a weight by a plurality of evaluation values.

As a condition for the evaluation value, a balance in a case where the number of particles and the area, circularity, and any shape thereof are fitted is used. With regard to the size of a hole, an area is output in a case where the area of the particle or any shape in a threshold value satisfying a condition is fitted, and particularly, an average value of a diameter, and the like are output in a case where an ellipse or a circle is fitted.

In this example, a case where the number of guide patterns is one and the number of DSA hole patterns is two has been described, but it is also possible to perform measurement by detecting two or more DSA holes. It is possible to perform the same processing on other guide patterns and DSA hole patterns within a screen and to output the respective measurement values.

REFERENCE SIGNS LIST

101: ELECTRON SOURCE
102: EXTRACTION ELECTRODE
103: PRIMARY ELECTRON BEAM (CHARGED PARTICLE BEAM)
104: FIRST CONDENSER LENS
105: DIAPHRAGM
106: SECOND CONDENSER LENS
107: SECONDARY ELECTRON DETECTOR
108: ALIGNMENT COIL
109: DEFLECTION COIL
110: OBJECT LENS
111: SAMPLE
112: STAGE
113: SAMPLE CHAMBER
114: SECONDARY ELECTRON
115: HIGH-VOLTAGE CONTROL APPARATUS
116: FIRST CONDENSER LENS CONTROL UNIT
117: SECOND CONDENSER LENS CONTROL UNIT
118: SECONDARY ELECTRON SIGNAL AMPLIFIER
119: ALIGNMENT CONTROL UNIT
120: DEFLECTION SIGNAL AMPLIFIER
121: OBJECT LENS CONTROL UNIT
122: DEFLECTION SIGNAL CONTROL UNIT
123: IMAGE PROCESSOR
124: SECONDARY ELECTRON IMAGE DISPLAY APPARATUS

The invention claimed is:
1. A defect inspection apparatus comprising:
a scanning electron microscope body including an electron source to provide an electron beam to irradiate a sample, a secondary electron detector to trap secondary electrons discharged from the sample when the sample is irradiated by the electron beam, and a signal amplifier receiving output from the secondary electron detector and outputting an amplified signal, and
a processor that detects a defect on the sample using data obtained from the amplified signal upon irradiating the sample with the electron beam by comparing a first image, obtained by irradiating the sample with the electron beam, and a second image, obtained by performing autocorrelation processing on the first image.

2. The defect inspection apparatus according to claim 1, wherein the processor generates the second image by cutting out a portion of an image obtained by performing the autocorrelation processing, and detects the defect based on determination of a correlation between the second image and the first image.

3. The defect inspection apparatus according to claim 2, wherein the processor generates a cross-correlation map based on the determination of the correlation between the first image and the second image.

4. The defect inspection apparatus according to claim 1, wherein the first image is obtained by reversing luminance upon irradiating the sample with the electron beam.

5. The defect inspection apparatus according to claim 4, wherein the processor generates the first image in a case where a pattern formed on the sample is a concave pattern.

\* \* \* \* \*